(12) United States Patent
Hoeink et al.

(10) Patent No.: US 7,825,686 B2
(45) Date of Patent: Nov. 2, 2010

(54) RECONFIGURABLE MAGNETIC LOGIC-CIRCUIT ARRAY AND METHODS FOR PRODUCING AND OPERATING SUCH LOGIC DEVICES

(75) Inventors: Volker Hoeink, Vienna (AT); Dirk Meyners, Schoenkirchen (DE); Guenter Reiss, Bielefeld (DE); Jan Schmalhorst, Bielefeld (DE); Arno Ehresmann, Zweibruecken (DE)

(73) Assignees: Universitaet Bielefeld, Bielefeld (DE); Universitaet Kassel, Kassel (DE)

( * ) Notice: Subject to any disclaimer, the term of this patent is extended or adjusted under 35 U.S.C. 154(b) by 0 days.

(21) Appl. No.: 12/452,742

(22) PCT Filed: Jul. 20, 2008

(86) PCT No.: PCT/DE2008/001178

§ 371 (c)(1),
(2), (4) Date: Apr. 13, 2010

(87) PCT Pub. No.: WO2009/012755

PCT Pub. Date: Jan. 29, 2009

(65) Prior Publication Data

US 2010/0225350 A1    Sep. 9, 2010

(30) Foreign Application Priority Data

Jul. 21, 2007    (DE) .................. 10 2007 034 256

(51) Int. Cl.
G06F 7/38       (2006.01)
H03K 19/173  (2006.01)

(52) U.S. Cl. ..................... 326/38; 326/37; 326/39; 326/104

(58) Field of Classification Search ........................ None
See application file for complete search history.

(56) References Cited

U.S. PATENT DOCUMENTS 6,914,807 B2 *   7/2005   Nakamura et al. .......... 365/158

(Continued)

FOREIGN PATENT DOCUMENTS

DE        100 53 206          1/2002

(Continued)

OTHER PUBLICATIONS

International Search Report.

(Continued)

*Primary Examiner*—Anh Q Tran
(74) *Attorney, Agent, or Firm*—Collard & Roe, P.C.

(57) ABSTRACT

The invention relates to a reconfigurable magnetic logic-circuit array having at least two magnetoresistive elements, each composed of at least two magnetic layers, which are separated from one another by an intermediate layer, in each instance, whereby one of the magnetic layers, as a reference layer, does not substantially change its magnetization under the influence of external magnetic fields, and the other magnetic layer, as a free layer, changes its magnetization perceptibly under the influence of external magnetic fields, and having at least one conductor for signal ports, with which conductor, when current is flowing, a first magnetic field can be generated that flips the magnetization of the free layers, and having a device for on-demand generation of a second variable magnetic field, which also influences the magnetoresistive elements. For this purpose, two such magnetoresistive elements are disposed adjacent to one another, whereby the magnetization of the two reference layers is oriented in opposite directions by means of preadjusted unidirectional anisotropy, and the magnetoresistive elements are interconnected with one another in such a manner that, as a result of the action of the first and second magnetic fields on the magnetoresistive elements, the switching behavior of all basic logic functions, especially the AND, OR, NAND, NOR, XOR or XNOR functions, can be induced on the basis of the resulting changes in the orientation of the magnetization of the free layers, and thus of the resistance of the magnetoresistive elements in the logic-circuit array.

52 Claims, 10 Drawing Sheets

U.S. PATENT DOCUMENTS

Figure 1:
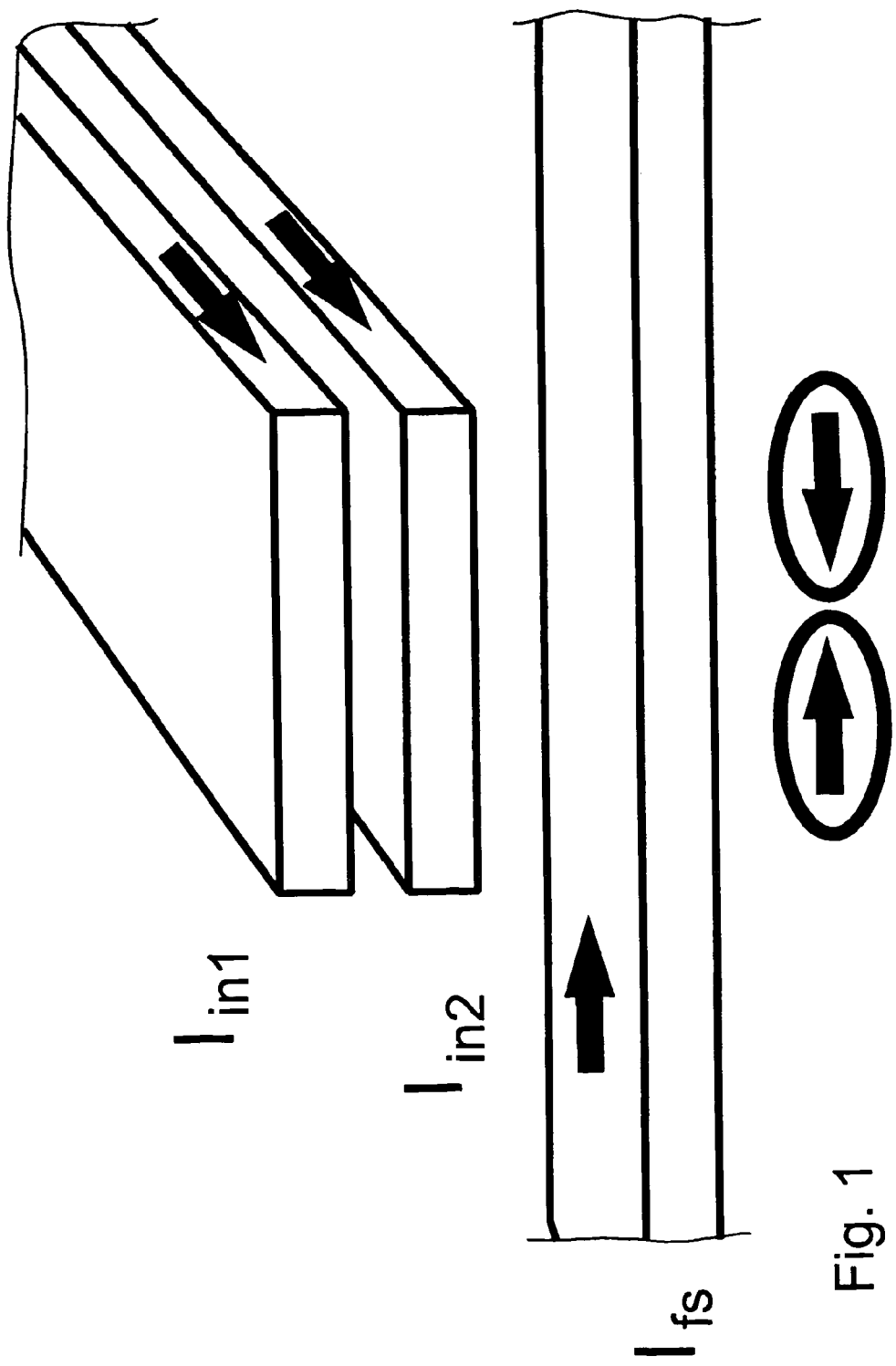

| | | | | |
|---|---|---|---|---|
| 7,755,930 | B2* | 7/2010 | Kim et al. | 365/158 |
| 2006/0164124 | A1 | 7/2006 | Koch et al. | |
| 2007/0290717 | A1* | 12/2007 | Bangert | 326/38 |

FOREIGN PATENT DOCUMENTS

| | | |
|---|---|---|
| DE | 101 13 787 | 9/2002 |
| DE | 102 55 857 | 7/2004 |

OTHER PUBLICATIONS

English translation of International Preliminary Report on Patentability and Written Opinion of the International Searching Authority, Feb. 2010.

Stuart S. P. Parkin et al., "Giant tunnelling magnetoresistance at room temperature with MgO (100) tunnel barriers," in Nature Materials, 2004, vol. 3, pp. 862-867. (Spec, p. 14).

W. J. Gallagher and S. S. P. Parkin, "Development of the magnetic tunnel junction, MRAM at IBM: From first junctions to a 16-Mb MRAM demonstrator chip," IBM Journal of Research and Development, vol. 50, No. 1, Jan. 2006, pp. 5-23A. (Spec, pp. 15 and 46).

R. Richter, L. Bär, J. Wecker and G. Reiss, "Nonvolatile field programmable spin-logic for reconfigurable computing," Applied Physics Letters, vol. 80, No. 7, Feb. 2002, pp. 1291-1293. (Spec, p. 46).

D. Meyners, K. Rott, H. Brückl, G. Reiss and J. Wecker, "Submicron-sized magnetic tunnel junctions in field programmable logic gate arrays," Journal of Applied Physics 99, (2006), pp. 023907-1 to 023907-4. (Spec, p. 46).

J. Hayakawa, S. Ikeda, Y. M. Lee, F. Matsukura and H. Ohno, "Effect of high annealing temperature on giant tunnel magnetoresistance ratio of CoFeB/MgO/CoFeB magnetic tunnel junctions," Applied Physics Letters 89, (2006), pp. 232510-1 to 232510-3. (Spec, pp. 14 and 46).

Freescale Semiconductor, Data Sheet, 256K × 16-Bit 3.3-V Asynchronous Magnetoresistive RAM, MR2A16A, 2006, Document No. MR2A16A, Rev. 3, Jun. 2006, pp. 1-16, published at http://www.freescale.com. (Spec, p. 47).

V. Höink, M. D. Sacher, J. Schmalhorst, G. Reiss, D. Engel, D. Junk and A. Ehresmann, "Postannealing of magnetic tunnel junctions with ion-bombardment-modified exchange bias," Applied Physics Letters 86, (2005), pp. 152102-1 to 152102-3. (Spec, p. 47).

* cited by examiner

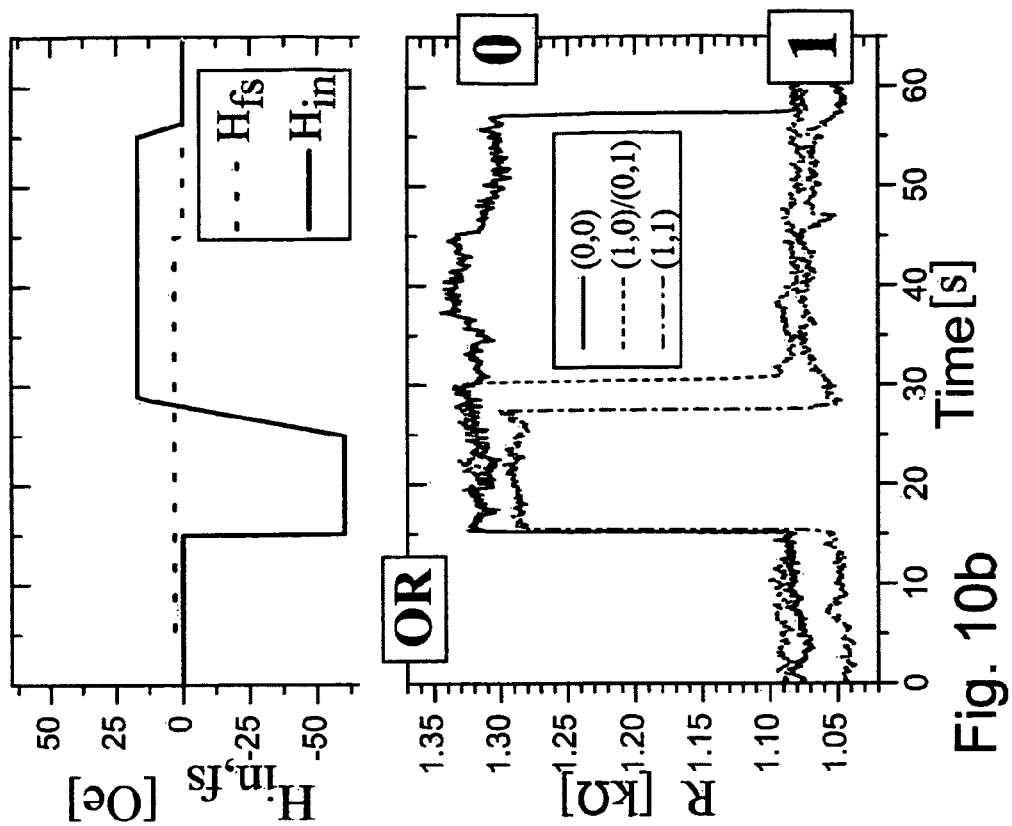
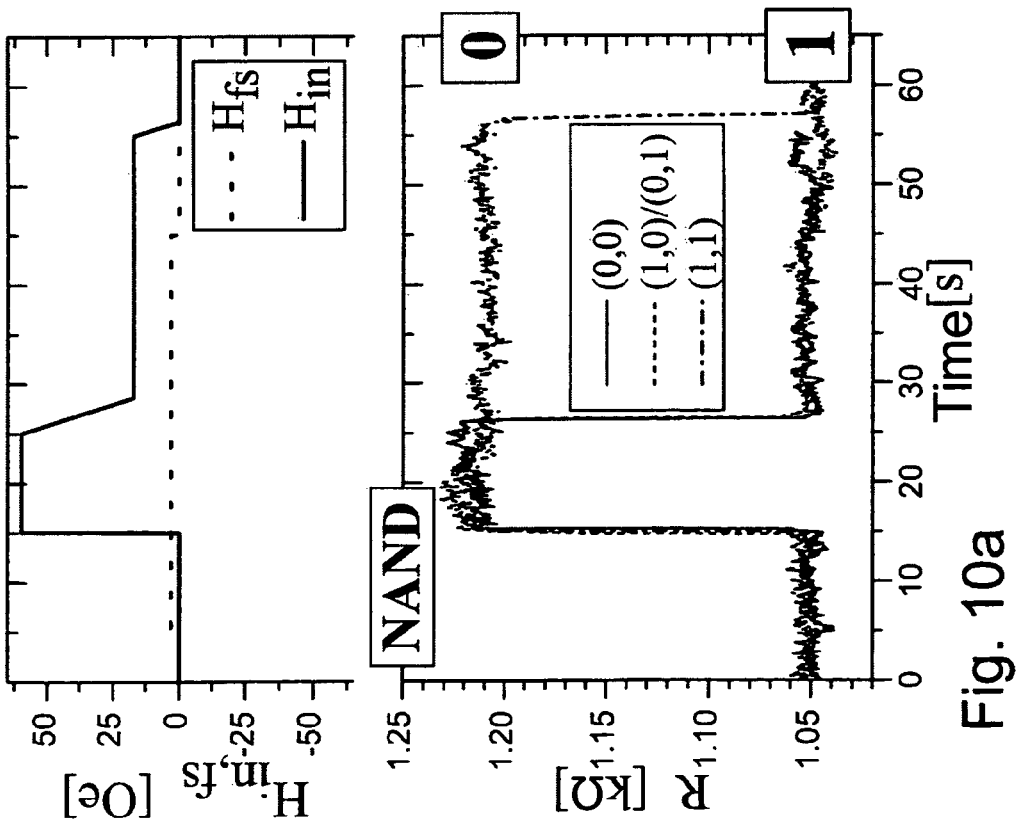
Fig. 10a
Fig. 10b

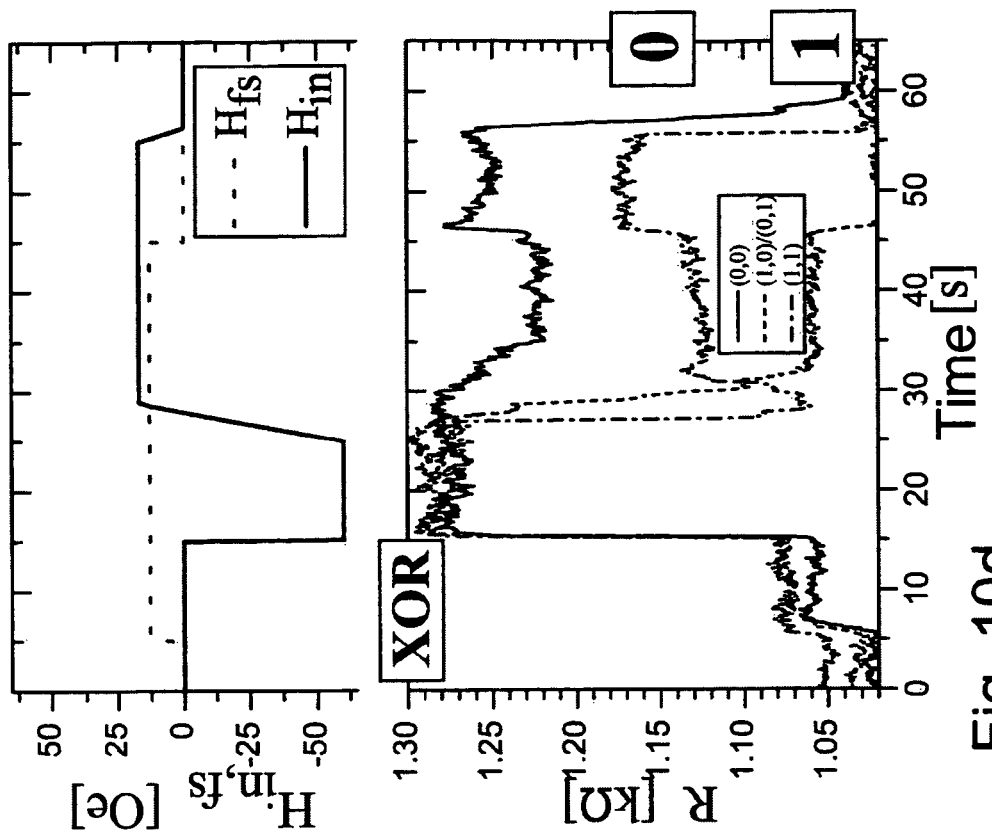
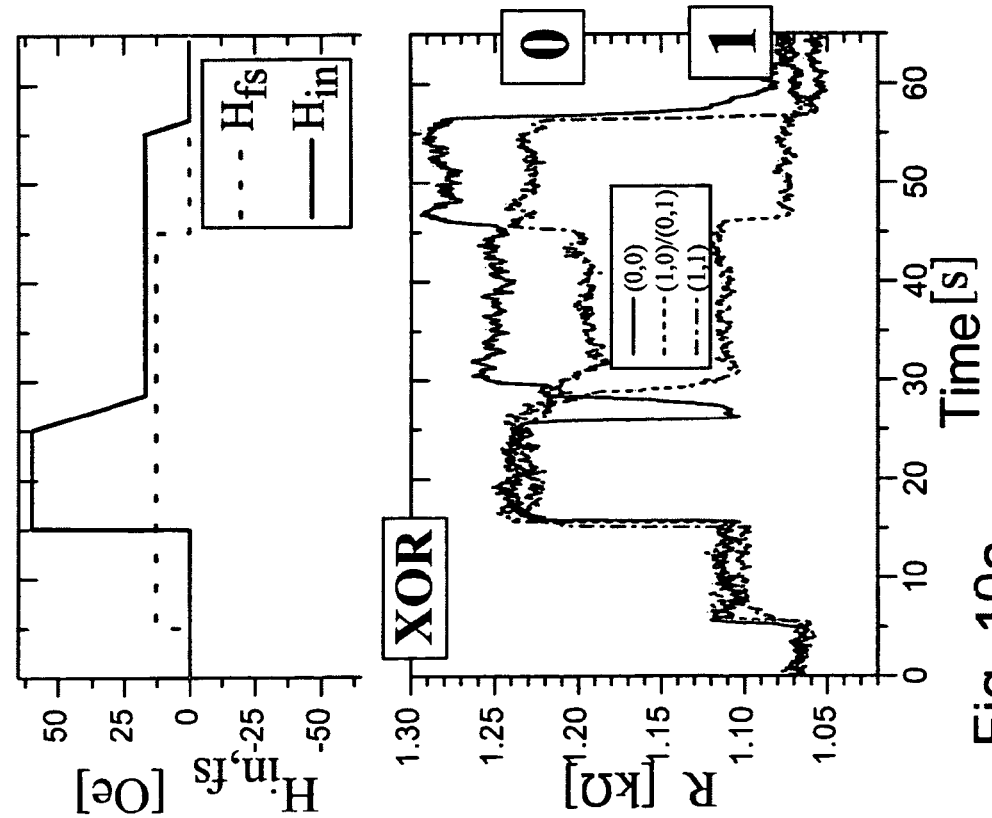
Fig. 10c
Fig. 10d

RECONFIGURABLE MAGNETIC LOGIC-CIRCUIT ARRAY AND METHODS FOR PRODUCING AND OPERATING SUCH LOGIC DEVICES

CROSS REFERENCE TO RELATED APPLICATIONS

This application is the National Stage of PCT/DE2008/001178 filed on Jul. 20, 2008, which claims priority under 35 U.S.C. §119 of German Application No. 10 2007 034 256.1 filed on Jul. 21, 2007. The international application under PCT article 21(2) was not published in English.

The invention relates to a reconfigurable magnetic logic-circuit array and to methods for producing and operating such logic-circuit arrays according to the preamble of claim 1 and of claims 40 and 46, respectively.

In the logic gates most commonly used at present, which gates are based on transistors, the various logic functions must be simulated by a large number of logic switching elements, each of which is suitable only for executing one particular function. At present, such logic switching elements are typically implemented in the form of CMOS technology, whereby the current flow through the switching elements makes the corresponding logic available on the basis of the signal levels. Disadvantages of these CMOS-type switching elements consist in that the result of the switching logic is available for only as long as current is also present in the circuit and is automatically lost as soon as the current is turned off, and in that the logic function of the switching element is fixed.

A more promising approach to overcoming these disadvantages is a reconfigurable logic, which uses small arrays of magnetic switching elements on the basis of magnetoresistive elements (MR). These have the additional advantage of a non-volatile output value, as is already used for technical applications, such as the MRAM technique (magnetic random access memory), for example. [1]

Most such memory devices are based on magnetoresistive elements, in which a phenomenon known as the exchange-bias effect plays a role.

It was already discovered years ago that this exchange-bias effect (EB) has an effect that permits a targeted change of the magnetic behavior of a ferromagnetic material (FM material). While the hysteresis loop of an FM material is normally oriented symmetrically with respect to the zero point of the external field, an FM material in contact with an antiferromagnetic material (AFM material) can have a hysteresis loop displaced from the zero point. If the displacement is great enough, the magnetic interaction with the AFM material ensures that only a single magnetization direction that is stable in the zero field will remain in the FM material. Since this anisotropy in the magnetization direction of the FM material is induced by the exchange interaction with the AFM material, the energy difference between two configurations is referred to as exchange anisotropy. Ferromagnetism in this context is understood to be parallel orientation of the magnetic moments of the material, which orientation leads to spontaneous magnetization below the critical temperature (Curie temperature). A characteristic property of such ferromagnetic materials is the occurrence of remanence and of hysteresis behavior of magnetic reversal. In antiferromagnetism, the magnetic moments are oriented in antiparallel relationship below the critical temperature (known as the Néel temperature) and thus compensate one another mutually.

This exchange displacement occurs in systems composed of ferromagnets and antiferromagnets if the Curie temperature of the ferromagnet is higher than the Néel temperature of the antiferromagnet, and the system either is produced in the magnetic field or is cooled below the blocking temperature in the magnetic field. The ferromagnet then has a hysteresis curve displaced on the magnetic-field axis, meaning that the ferromagnet behaves as if it were exposed to an internal displacement field. The cause of this displacement field lies in the exchange coupling between the antiferromagnetic and ferromagnetic spins at the interface, thus giving rise to the name exchange displacement. In principle, the occurrence of such an exchange displacement can be described as follows. If the system is above the Néel temperature, the antiferromagnetic spins are freely mobile and, at the interface between FM and AFM, for example, will become oriented parallel to the spins of the ferromagnet oriented by the external field. If the system is now cooled below the Néel temperature, the antiferromagnetic spins become "frozen" and, after removal of the external field, now act in the opposite manner on the ferromagnets, as an internal displacement field, again due to the exchange coupling. For many systems of ferromagnet and antiferromagnet, the Néel temperature of the AFM is clearly lower than the Curie temperature of the FM. If such a system is cooled in an external field, or if magnetized FM is cooled below the blocking temperature of the antiferromagnet, an exchange bias, in other words the displacement of the hysteresis curve, is developed. This phenomenon is usually accompanied by broadening of the hysteresis. At present thin-layer systems are primarily used for this purpose, since they permit better control of the growth parameters (interface roughness, grain uniformity, orientation), and are clearly more relevant for applications.

Various possibilities exist for implementing magnetoresistive elements in technical applications. If the two ferromagnetic layers are separated by a nonmagnetic metal, a giant magnetoresistance system (GMR) is obtained. In this system, the electrical resistance perpendicular or parallel to the layer plane depends strongly on the orientation of the magnetizations of the two ferromagnets relative to one another. GMR elements are used, for example, in hard-disk reading heads. In tunneling magnetoresistance elements (TMR elements), on the other hand, the two ferromagnetic layers are separated by a nonmagnetic insulator. The tunnel current perpendicular to the layer plane depends on the orientation of the two magnetizations relative to one another.

Exchange bias is technologically interesting, since it plays an important role in spin valve systems, for example. These systems contain two ferromagnets, one of which may be freely reversed magnetically, whereas the other is fixed as a reference. This "pinning" of the reference layer is achieved, for example, by means of coupling to an antiferromagnet.

The lateral displacement of the hysteresis loop, which is merely one of the effects of the FM-AFM interaction, has already been used for some years in technological applications, including the area of data storage. In the present generation of hard-disk reading heads, a layer system is used, which among other layers contains two ferromagnetic layers and one antiferromagnetic layer for optimizing the reading-head properties. By virtue of the antiferromagnetic layer, the magnetization of one of the two ferromagnetic layers is fixed in a precisely defined direction by the exchange-bias effect (this is the "pinning" already mentioned). The magnetization of the second ferromagnetic layer is freely rotatable and is oriented by the bits written on the hard disk. What is then measured is a signal that depends on the relative orientation of the two ferromagnetic layers, relative to one another.

EB has also been described already for the production of reconfigurable magnetic switching arrays.

An example of a configurable logic based on magnetic switching elements, which logic is composed of six magnetic tunnel junctions (MTJ) per logic unit, has been described in [2]. This design can be used for all basic logic functions except for XOR. Logic-circuit arrays having at least one magnetoresistive element, with which a conductor having at least two signal ports is associated, whereby a magnetic field acting on the magnetoresistive element can be generated when current is flowing through the conductor, so that the magnetization of a magnetically soft layer of the magnetoresistive element can be flipped by means of the magnetic field are known from DE 100 53 206 C1 and in a continuation of DE 101 13 787 C1. In this case, means for on-demand generation of a further magnetic field oriented substantially perpendicular to the magnetization of the magnetically soft layer are provided in the logic-circuit arrays, with which means it is possible to change the mode of operation and thus the logic of the logic-circuit array. Because of the additional magnetic field, the coercive field intensity necessary for rotation or flipping of the magnetization of the magnetically soft layer is decreased, and thus a smaller magnetic field is already sufficient for flipping the magnetically soft layer. Depending on the two signals for activation of the logic-circuit array, a response of the logic-circuit array is then generated in a manner dependent on the additional magnetic field, and can be processed further. According to DE 101 13 787 C1, the additional magnetic field can also be implemented directly via a magnetic effect, without current flow.

A magnetic logic device as well as a method for operating such a logic device are known from DE 102 55 857 B3, in which the logic device is adjusted, before operation, with a specific operator-control signal, to a start condition for executing the operator function, and the operator-control signal is selected from a group of different types of control signals, with which various nonvolatile starting conditions of the logic unit can be adjusted in targeted manner, each being characteristic for specific logic functions. This logic device is formed from individual logic elements, which are not coupled with one another and which must each be flipped, in a complicated and resource-consuming manner, to a corresponding operating condition before each execution of a logic step. Furthermore, the scope of the available logic functions is limited.

The task of the present invention is therefore to provide a logic-circuit array and methods for producing and operating such logic-circuit arrays, with which all logic circuits necessary for practical use can be generated and optionally used, in simple manner, by means of a stand-alone logic-circuit module.

The task according to the invention is achieved with respect to the logic-circuit array by the characterizing features of claim 1, and with respect to the methods by the characterizing features of claims 40 and 46, in combination with the features of the associated preamble. Further advantageous embodiments of the invention are specified in the dependent claims.

The invention with respect to the circuit array proceeds from a reconfigurable magnetic logic-circuit array having at least two magnetoresistive elements, each composed of at least two magnetic layers, which are respectively separated from one another by an intermediate layer, whereby one of the magnetic layers, as a reference layer, does not substantially change its magnetization under the influence of external magnetic fields, and the other magnetic layer, as a free layer, changes its magnetization perceptibly under the influence of external magnetic fields, and having at least one conductor for at least two signal ports, with which conductor, when current is flowing, a first magnetic field can be generated that acts on the magnetoresistive elements and flips the magnetization of the free layers, and having a device for on-demand generation of a second variable magnetic field, which also influences the magnetoresistive elements. Such a circuit array is further developed inventively in that two such magnetoresistive elements are disposed adjacent to one another, whereby the magnetization of the two reference layers is oriented in opposite directions by means of preadjusted unidirectional anisotropy and the magnetoresistive elements are interconnected with one another in such a manner that, as a result of the action of the first and second magnetic fields on the magnetoresistive elements, the switching behavior of all basic logic functions, especially the AND, OR, NAND, NOR, XOR or XNOR functions, can be induced on the basis of the resulting changes in the orientation of the magnetization of the free layers, and thus of the resistance of the magnetoresistive elements in the logic-circuit array. In this way, it is possible to induce all technically relevant logic functions such as the AND, OR, NAND, NOR, XOR or XNOR functions, using the same circuit, with a simple interconnection of two magnetoresistive elements, as well as on the basis of the opposite magnetization of the reference layers of these two magnetoresistive elements, while observing the resulting displaced hysteresis curve of each of the magnetoresistive elements, in that the respective magnetization behavior of the magnetoresistive elements is influenced by magnetic effects of the signal currents as well as of a second optionally controllable magnetic field, and the selected response behavior of the logic-circuit array can be adapted as needed, without great consumption of resources. Under these conditions, the opposite magnetization of the reference layers of the magnetoresistive elements is of great importance, since it is by this, in combination with the effects of the externally applied magnetic fields, that a targeted influence on the magnetization properties of the magnetoresistive elements can be achieved, since hereby a displacement of the hysteresis curves of the free FM layers of the individual magnetoresistive elements relative to one another can be induced, with which displacement, and with suitable passages under the influence of the externally induced first and second magnetic fields, the interaction of the magnetoresistive elements in the circuit array can be optionally influenced to adapt to the respective needed logic circuit. In this way it is possible, with only one circuit, to achieve all needed logic functions, which of course can be provided in large numbers on corresponding switching units and thus can form a powerful reprogrammable logic-circuit array. At the same time, the result of a circuit containing the circuit array is nonvolatile and can remain stable for prolonged periods without supplying current.

Another advantage is that the device for on-demand generation of the second variable magnetic field comprises a conductor that can carry current and is oriented in a position perpendicular to the conductor for the at least two signal ports. For this purpose, a magnetically active element can be disposed in the zone of the logic-circuit array, and preferably the conductor or conductors for the at least two signal ports of the second variable magnetic field comprises or comprise such a magnetically active element, whose magnetic field is oriented parallel or antiparallel to the magnetization of the reference layer of the magnetoresistive elements. The second magnetic field for selection of the logic function can be generated by external coils, for example, as can the first magnetic fields for the signals, in which case the second magnetic field induced thereby can run parallel to the short axis of the magnetoresistive elements, which preferably have an elliptical shape. Also conceivable would be the use of micro-electronic mechanical systems (MEMS), as are now being developed for mirror arrays in projectors, for example, in combination with minute permanent magnets, or the parallel use of a large number of magnetic tips, such as are used in the MFM (magnetic force microscope). Also conceivable, in principle, would be generation of magnetic fields by other techniques, such as magnetostriction.

It is also of importance that the first and second magnetic fields overlap in such a way, with respect to the circuit of the magnetoresistive elements, that the switching behavior of all basic logic functions, especially the AND, OR, NAND, NOR, XOR or XNOR functions, can be adjusted in optional manner to the circuit of the magnetoresistive elements. The mutual influence of the overlapping first and second magnetic fields as well as the influence resulting therefrom on the magnetic behavior of the magnetoresistive elements can then be used to adjust the respective desired operating condition of the logic-circuit array by means of the hysteresis behavior of the circuit of the magnetoresistive elements, which can be interconnected with one another in series or in parallel, for example, in that the switching thresholds of the magnetoresistive elements are overcome or not overcome by one or both signals. Depending on the logic function selected in this case, the switching thresholds can be influenced, in targeted manner, by the second magnetic field, in such a way that only the respective desired logic circuit can be adjusted under the effect of this second magnetic field.

It is also advantageous if the magnetic layers of the magnetoresistive elements are formed from ferromagnetic materials, such as magnetically hard material for the reference layers and magnetically soft material for the free layers. For this purpose, CoFe, NiFe, CoFeB or Heusler compounds can be advantageously used as ferromagnetic materials. For magnetic tunnel junctions (MTJs) containing MgO barriers, CoFeB is highly valued at present, since high effect amplitudes have been achieved with sputtered CoFeB layers (see, for example, J. Hayakawa in Appl. Phys. Lett. 89, 232510 (2006)). Fe/MgO/Fe systems (see, for example, S. S. P. Parkin in Nature Materials, Vol. 3, 862 (2004)) have also been very successful. By virtue of the high expected spin polarization, Heusler compounds are also very promising.

In particular, if the intermediate layer is an insulator layer, magnesium oxide (MgO) or aluminum oxide ($Al_2O_3$) can be used as the insulator-layer material, in which case the magnetoresistive elements are tunnel magnetic resistance elements (TMR elements). Typical technically usable layer stacks for use in TMR elements are composed, for example, of 25 nm of Cu (lower supply conductor)/12 nm of $Mn_{83}Ir_{17}$ (for exchange bias)/3 nm of $CO_{70}Fe_{30}$ (reference layer)/1.3 nm of Al+plasma oxidation as a barrier/4 nm of $Ni_{80}Fe_{20}$ (second FM electrode) and, as the upper protective layers, 3 nm of Ta/47 nm of Cu/26 nm of Au. As regards selecting the materials, it is advantageous to obtain an approximately parallel or antiparallel orientation of the magnetizations, depending on the first magnetic field. Furthermore, it is also possible to replace individual materials, to add additional buffer layers for better growth, to replace individual ferromagnetic layers with artificial ferrimagnets (composed of two FM layers coupled in antiparallel by means of intermediate-layer exchange coupling), in order to achieve a smaller magnetic net moment (this is described, for example, by W. J. Gallagher et al. in IBM J. RES. & DEV. VOL. 50, 5 (2006)), to add a second barrier and a further ferromagnetic layer and to make numerous other changes, as is frequently described in the various literature on such magnetic layer structures. What is always essential, however, is the ferromagnet/insulator/ferromagnet sequence.

It is also conceivable for the intermediate layer to be a nonmagnetic metal layer and for the resulting magnetoresistive elements to be giant magnetic resistance elements (GMR elements). In such a spin valve, the essential structure can be composed of an antiferromagnet/ferromagnet/nonmagnet/ferromagnet, whereby the antiferromagnet/ferromagnet part is responsible for pinning. Alternatively, it is also possible to dispense with the antiferromagnet and to achieve the antiparallel orientation of the two ferromagnets by a suitable selection of the intermediate layer thickness and the antiferromagnetic intermediate-layer exchange coupling resulting therefrom. However, since this yields symmetric MR curves, it can be used only to a limited extent for this logic.

Furthermore, it is also conceivable for the substantially invariable magnetic behavior of the reference layers of the magnetoresistive elements to be stabilizable by additional magnetic layers having strong unidirectional anisotropy and/or high coercive field intensity, which can be coupled antiferromagnetically to the reference layers via a nonmagnetic layer. For this purpose, the opposite magnetization of the reference layers can also be achieved beforehand by the methods yet to be described hereinafter for simple reference layers, for example by means of ion bombardment, in which case an antiferromagnetic coupling can be transformed into a ferromagnetic coupling by the ion bombardment. In this case it is important, in particular, that the unidirectional anisotropy of the reference layers of the two magnetoresistive elements be oppositely oriented. With regard to fixation of the magnetization direction of the reference layer by exchange bias, it is necessary that the magnetization direction of a ferromagnetic layer be fixed for the external magnetic fields to be expected during operation. This direction must then be allowed to vary locally. As an example, it would be possible to select a ferromagnetic layer having high uniaxial crystal anisotropy and a very large coercive field, which does not change its magnetization direction in the external magnetic fields that may occur. It would be possible to couple the actual reference layer of the magnetoresistive elements to this in antiparallel by means of interlayer-exchange interaction. This can be achieved, for example, by a ruthenium intermediate layer having a thickness of approximately 1 nm. If this system is bombarded locally with high doses of He ions, for example, the antiparallel coupling is transformed to a parallel coupling (this has already been demonstrated for various material combinations). In this way, the desired local variation of the magnetization direction of the reference layer is achieved. Also conceivable, however, is the use of any other form of unidirectional anisotropy.

It is further of importance for the field intensity at the location of the magnetoresistive elements interconnected with one another to be substantially equal, since hereby uniform behavior of the two magnetoresistive elements is induced.

In a first embodiment, it is conceivable that the input signals are impressed on the circuit of the magnetoresistive elements by at least one, preferably even two parallel conductors, on which individually or simultaneously different current intensities for the different signal levels of a logical "0" or a logical "1" are output to the circuit of the magnetoresistive elements. The two signal levels are added together and induce a magnetic field effect around the conductor or conductors that cause the desired switching behavior. In a further configuration of this type, the magnetic field generated by the conductor or conductors should be oriented parallel to the magnetization direction of the reference layers. From this, a magnetic field results, in such a way that a negative field with a negative current for both signals, a zero field with a positive or negative current for one of the two signals, in each instance, and a positive field with a positive current simultaneously for both signals are established.

Instead of the simple current-carrying conductors for coupling the magnetic fields induced in a manner that matches the signal condition, pinned magnetically hard paths can also be applied on the at least one conductor for impression of the input signals in such a way that a stray field is obtained, whose amplitude is the same as but whose orientation is opposite to those of the magnetic field that would be obtained on the basis of current flow through the conductor. For this purpose, the stray field can be established by the thickness of the pinned magnetically hard paths and the direction of pinning relative to the structure. In this case, no bipolar currents are necessary for impression of the signals.

Furthermore, it is also conceivable that instead of positive or negative switching thresholds, different positive magnetic field intensities are used to represent the individual switching responses of the circuit of the magnetoresistive elements. It is also conceivable that a difference between the conductivity or resistance of the two magnetoresistive elements indicates a switching response of the circuit of the two magnetoresistive elements, in which case a zero difference between the conductivity or resistance of the two magnetoresistive elements can be understood as a logical "0" and a large resistance difference can be understood as a logical "1".

As regards the reproducibility of the switching states of the logic-circuit array, it is important that the circuit of the magnetoresistive elements be switched to a well-defined initial condition before any switching operation. For this purpose, a well-defined initial condition is adjusted by positive or negative saturation of the free layers of the magnetoresistive elements, and the actual switching behavior of the logic-circuit array is selected and adjusted by the action of the second magnetic field, starting from this initial condition.

The invention further relates to a method for producing a reconfigurable magnetic logic-circuit array according to claim 1, in which method, before, during or after the production of the magnetoresistive elements, a targeted orientation of the magnetization of the reference layers is produced, at least in certain portions, in the zones in which the magnetoresistive elements are disposed, and before, during or after the complete or partial production of the magnetoresistive elements, the orientation of the magnetization of the respective reference layer is changed in the case of fixable magnetoresistive elements or in the zones in which magnetoresistive elements are disposed. For this purpose, various possible methods exist for producing the magnetoresistive elements and their targeted orientation relative to the magnetization of the respective reference layer. In particular, uniform production of the pinning on the entire circuit board (deposition in the field or cooling in the field after production of the MTJ layers) and subsequent complete production of the MTJ layers is conceivable. Thereafter, the pinning is manipulated by means of ion bombardment or laser treatment. Alternatively, uniform production of pinning may also be achieved on the entire circuit board (for example, deposition in the field or cooling in the field at the earliest after deposition of the reference layer) and subsequent partial production of the MTJ layers (for example, up to the reference layer), after which the pinning is manipulated by means of ion bombardment or laser treatment and then the rest of the MTJs is produced (this can be used, for example, for preservation of the barrier). Furthermore, it is conceivable that pinning on the circuit board will not be initialized at first, but instead the MTJs will first be produced completely or partly, and then pinning will be manipulated in two passes by means of ion bombardment or laser treatment during the production process (for example, after deposition of the reference layer) or subsequently, after complete production of the MTJ layers. For this purpose, all MTJs are first treated with the one pinning direction, and then all are treated with the other pinning direction. This would have the advantage that all tunnel elements are bombarded with the same ion dose and thus should exhibit the same TMR or resistance change. Likewise, it would be conceivable to orient the pinning direction of the two MTJ types in antiparallel beforehand, by means of separate deposition of layers in the magnetic field. In all of the aforesaid procedures, it is possible to use basically known steps of standard lithographic techniques and etching techniques for production of the magnetoresistive elements on thin-layer circuits, for example, and nevertheless provide approximately every second or even every nth magnetoresistive element with opposite magnetization of the reference layer, in order to enable use in a logic-circuit array according to claim 1. In this case, a selective change of the orientation of the magnetization of the respective reference layer is possible by ion bombardment in a magnetic field, by local heating of the reference layer in a magnetic field, preferably by a laser, by separate sputtering of parts of the magnetoresistive elements in opposite external magnetic fields, and by further techniques suitable for this purpose. In techniques such as ion bombardment, which extend over the entire surface, the magnetoresistive elements to be changed can be specifically selected by covering those portions that are not to be changed in the magnetoresistive elements that are not to be changed, preferably by means of covering masks or the like.

The invention further relates to a method for operation of a reconfigurable magnetic logic-circuit array according to claim 1, in which method, during operation of the circuit of the two magnetoresistive elements, the free layers of the magnetoresistive elements are saturated negatively or positively before any switching operation, and then the magnetic field for selection of the logic function is adjusted and/or the logic signals are output to the at least one conductor, and in this way, the magnetization of the free layers of the magnetoresistive elements is changed and the logic response of the circuit is ascertained. This sequence ensures well-defined switching states of the logic-circuit array for each cycle of magnetization, and the result of the logic circuit is therefore independent of preceding cycles. Furthermore, in this case, saturation of the free layers of the magnetoresistive elements can also be selected in a manner that depends on the logic function to be adjusted in the circuit of the magnetoresistive elements, in order to optimize the magnetization behavior of the free layers of the magnetoresistive elements. It is advantageous if the at least one conductor for supplying the input signals is then also used to supply the saturation of the free layers of the magnetoresistive elements.

It should also be noted that before the logic signals are turned off, the magnetic field for selection of the logic function is turned off, in order to ensure nonvolatility of the switching result produced.

It is further advantageous if pulsed currents are used for generation of the magnetic field for selection of the logic function, as well as for the logic signals.

It is also conceivable that the identical logic-circuit arrays on the common logic circuit simultaneously execute different or also simultaneously execute identical logic functions, depending on the setting.

A particularly preferred embodiment of the inventive logic-circuit array is shown in the drawing.

Figure 2A:
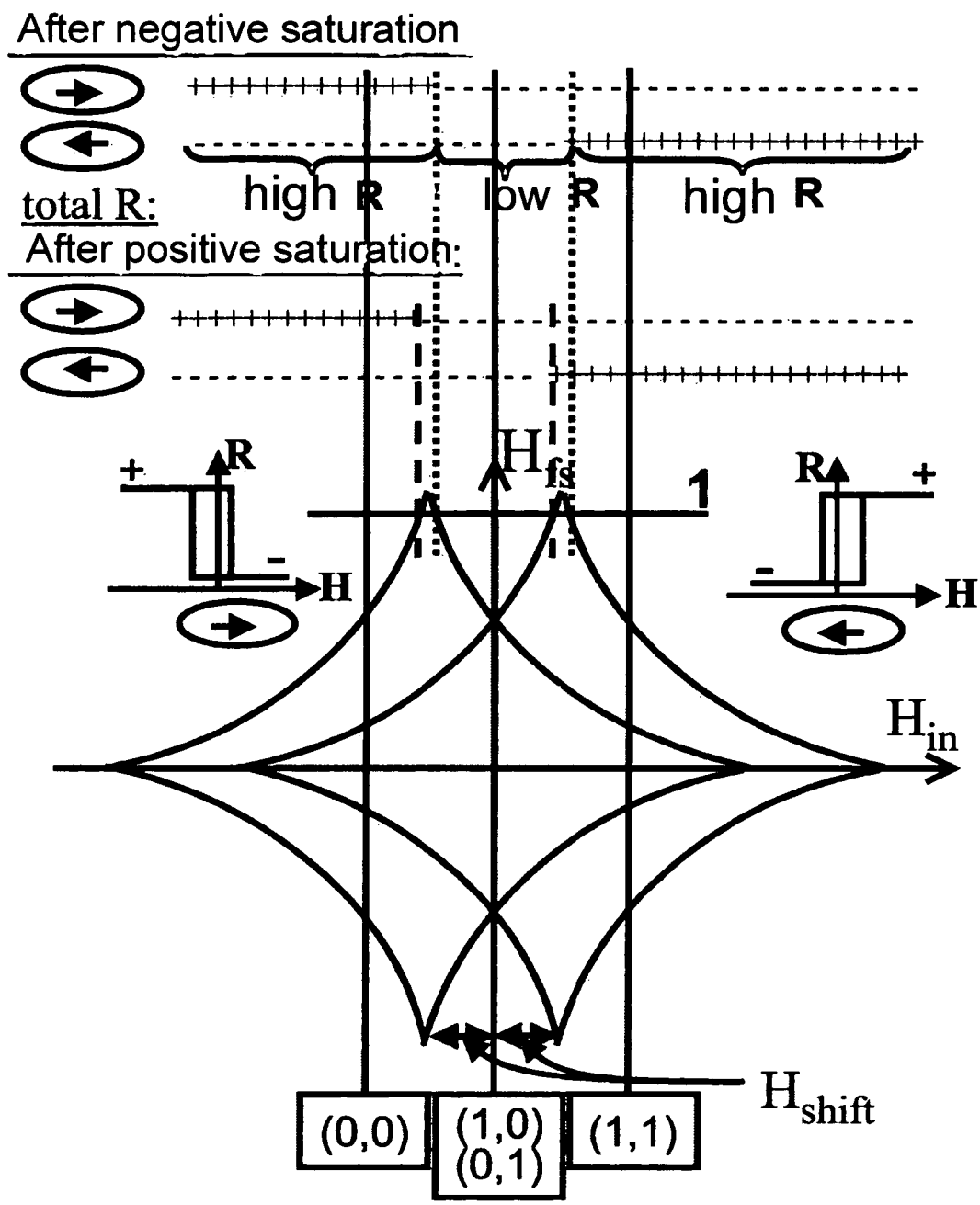
Figure 3:
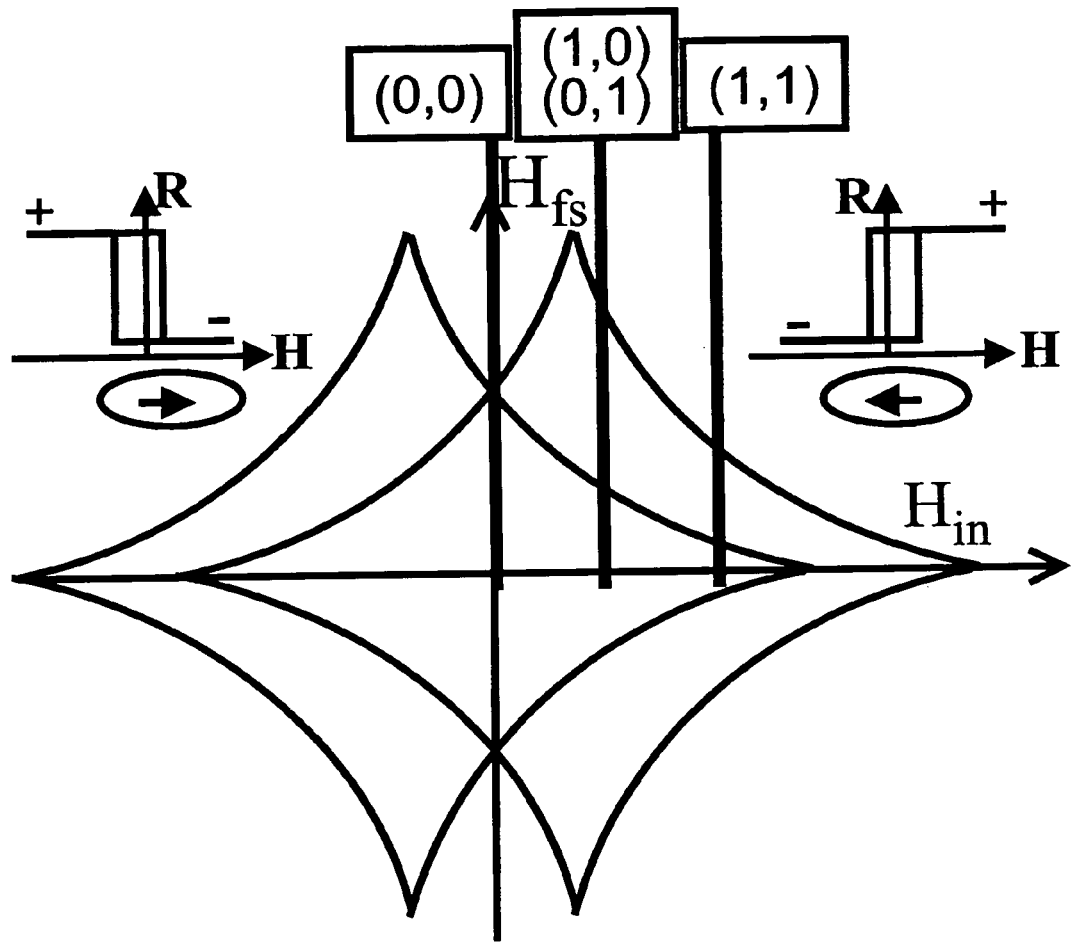
Figure 4A:
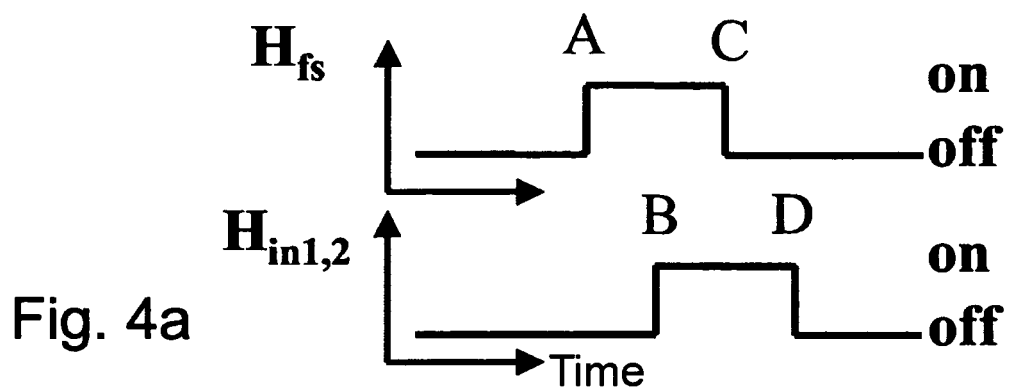
Figure 4B:
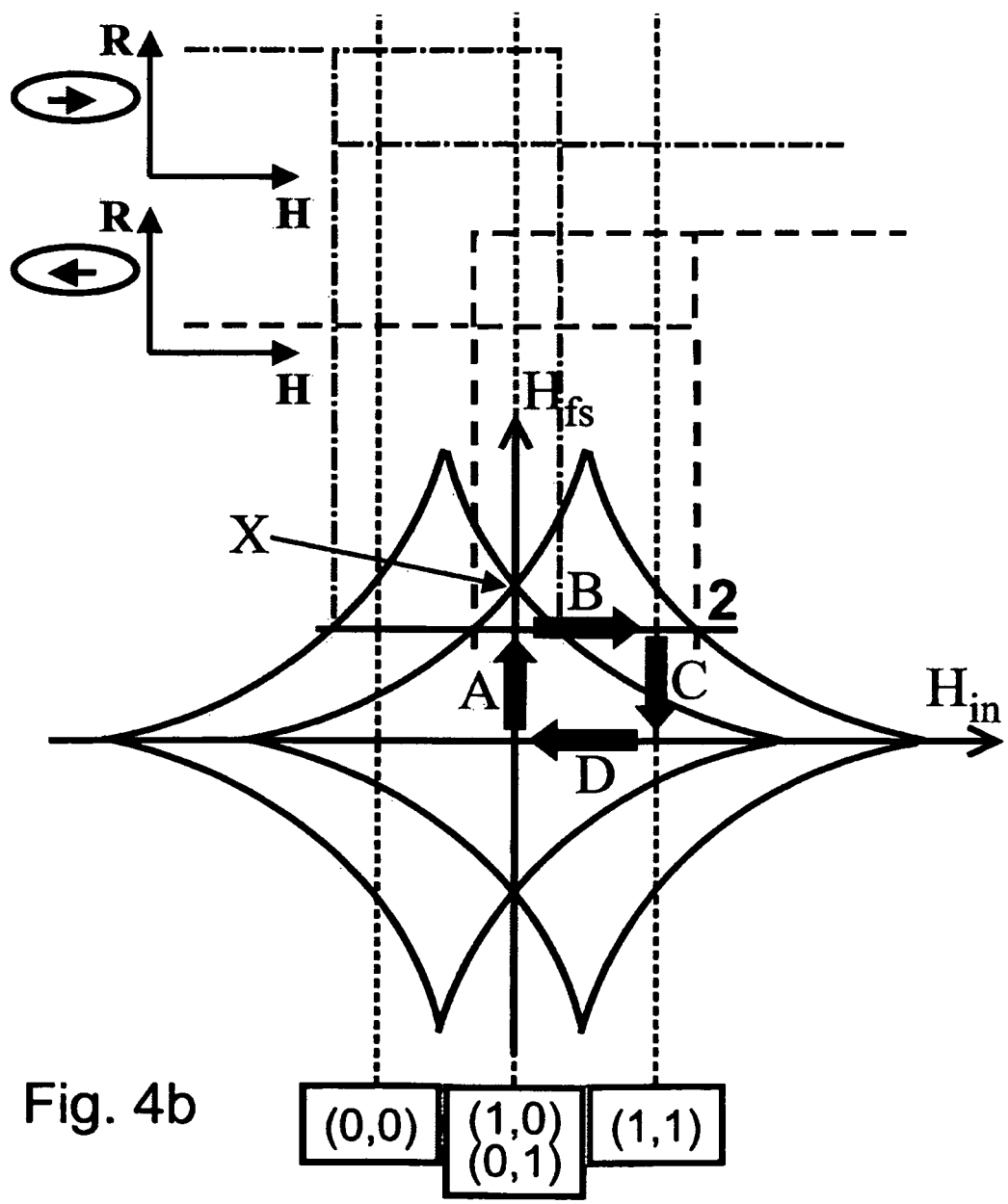
Figure 5:
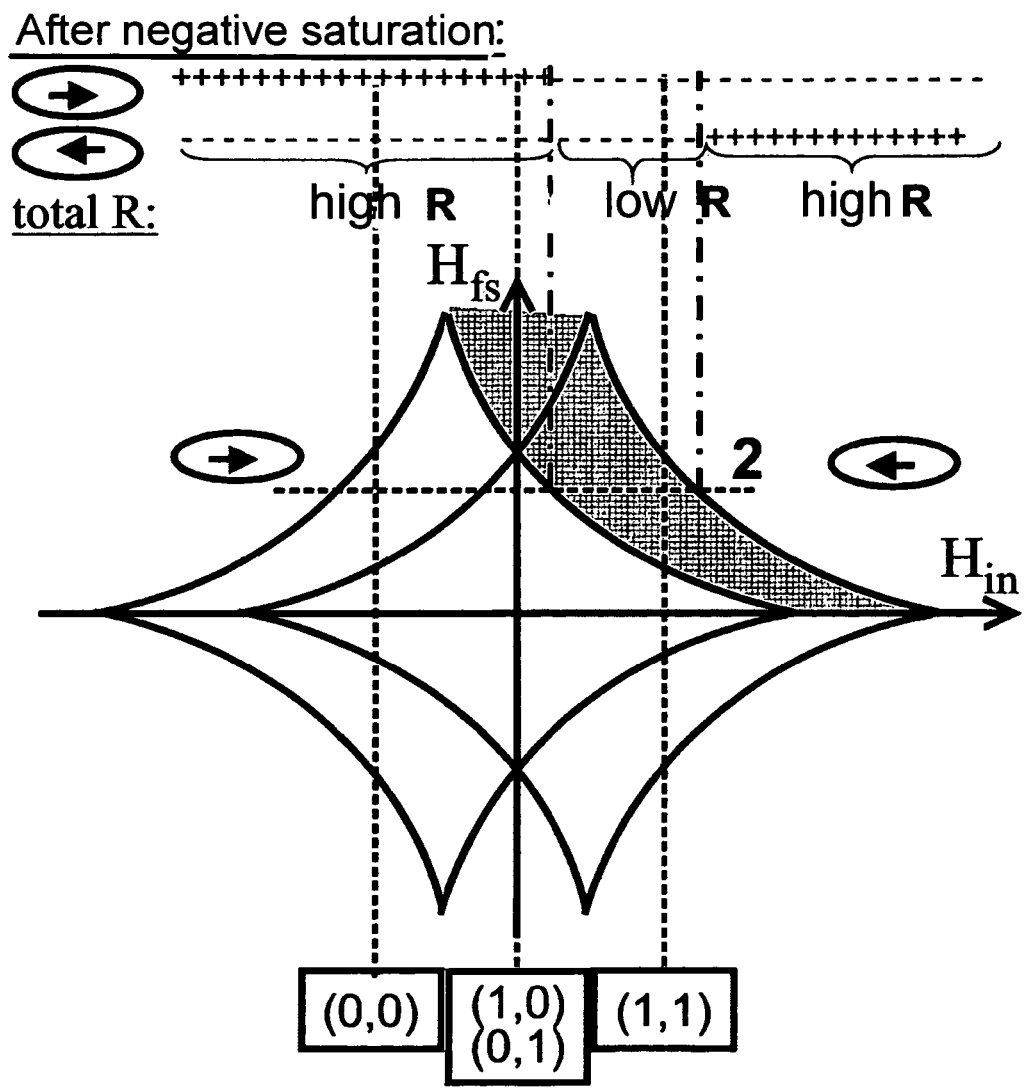
Figure 6:
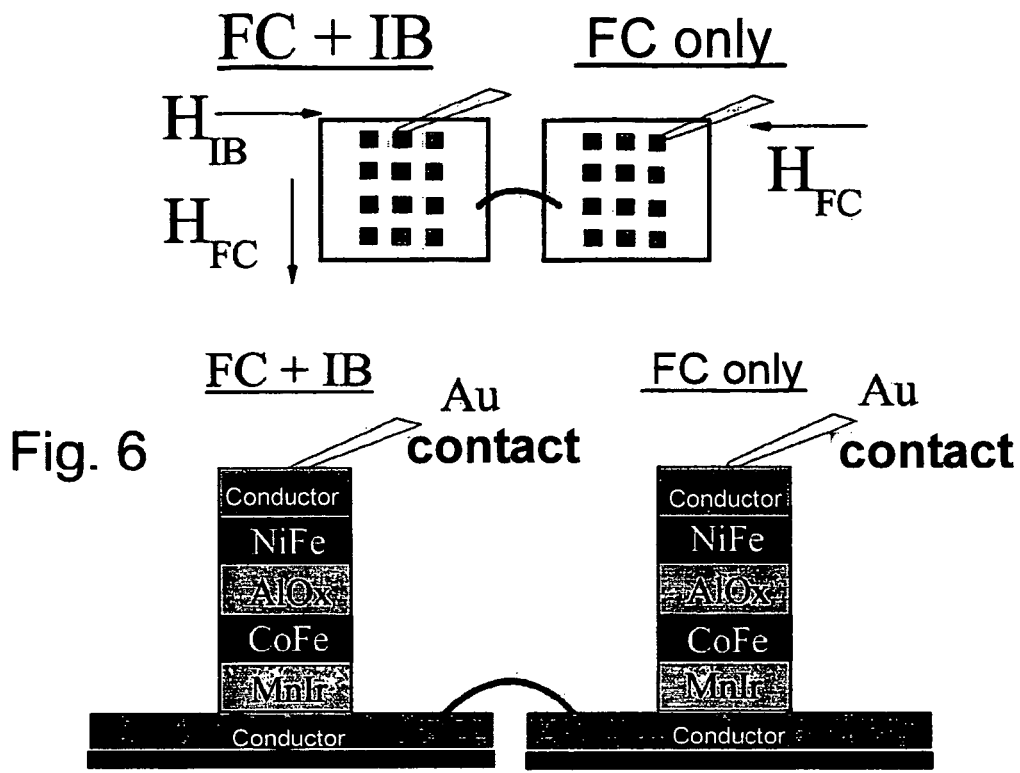
Figure 7:
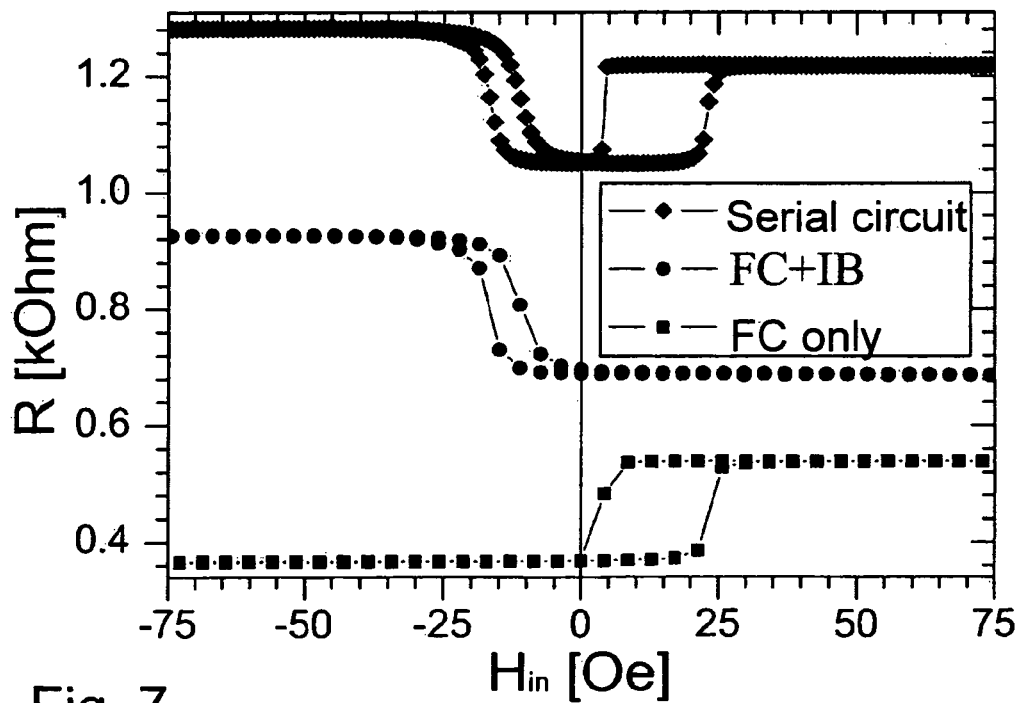
Figure 8:
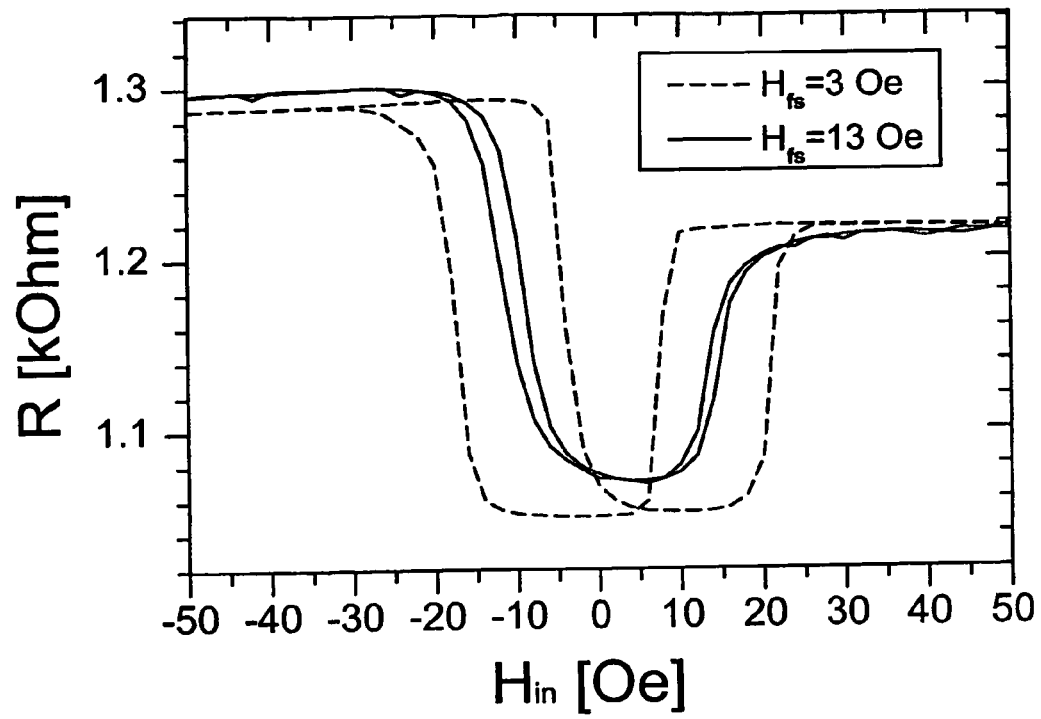
Figure 9:
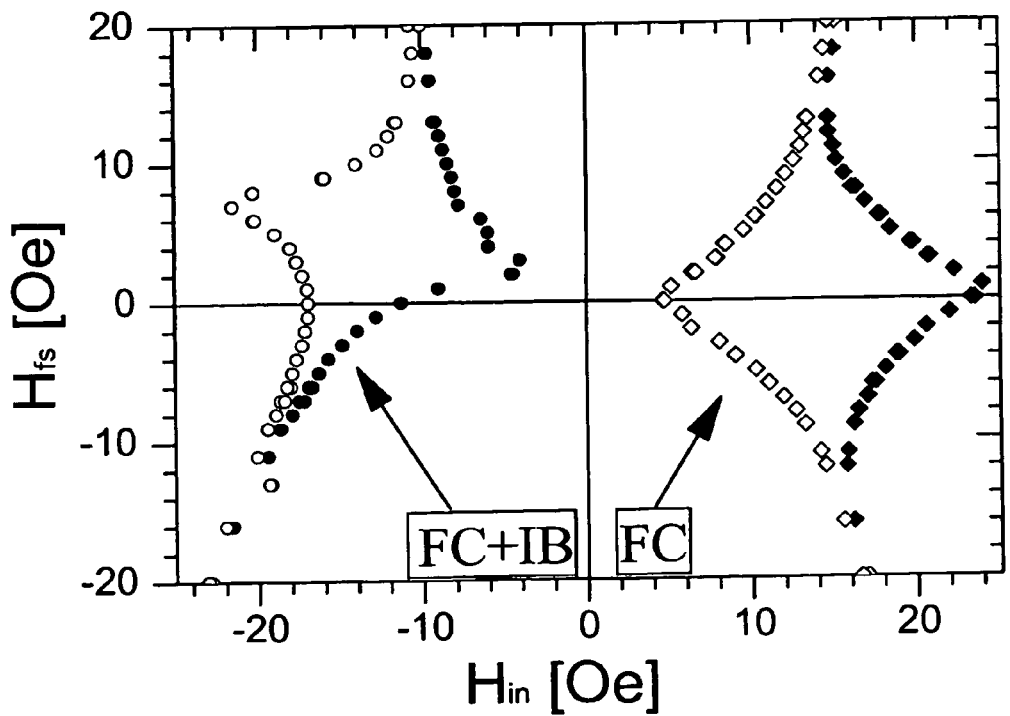

This shows:

FIG. 1—a schematic diagram of the fundamental structure of an inventive logic-circuit array for a reconfigurable magnetic logic, which is composed of two elliptical MTJs with opposite direction of the EB, FIG. 2a, switching asteroids for various switching states of 2b—the logic-circuit array according to FIG. 1, FIG. 3—switching asteroids for switching states exclusively in the case of positive input-signal currents, FIG. 4—schematic diagram of the passage through a switching asteroid in the course of a logic-circuit cycle, FIG. 5—displacement of the zone of low resistance by variation of the field intensity of the function-selection field after saturation with a negative field, FIG. 6—schematic structure of the layers and of the interconnection of the MTJs of the inventive logic-circuit array, FIG. 7—minor loops of an MTJ treated by ion bombardment, of an MTJ not treated by ion bombardment, and of a serial circuit of these two MTJs, FIG. 8—minor loops of the MTJs treated by ion bombardment and not treated by ion bombardment in a serial circuit, FIG. 9—measured switching asteroids of an MTJ treated by ion bombardment and of an MTJ not treated by ion bombardment, FIGS. 10a-d various switching sequences and measured values for the NAND, OR and XOR functions.

The inventive logic-circuit array for a reconfigurable magnetic logic is shown purely schematically in FIG. 1. The main part of this logic-circuit array is composed of two MTJs interconnected with one another and having an opposite magnetization direction of the unidirectional anisotropy caused by the exchange-bias interaction (EB). In this case, the arrows inside the ellipses schematically denote the direction of magnetization of the reference layers pinned by virtue of the unidirectional anisotropy. From this, an oppositely oriented magnetization of the two reference layers results for the relatively small external magnetic fields being used while the hysteresis behavior of the magnetoresistive elements is being measured by means of minor loops. In order to implement this concept, the direction of the EB can first be set homogeneously on the entire sample during production of the magnetoresistive elements, for example by intensifying the field during sputtering or by additional cooling in a magnetic field after sputtering. The direction of the EB for one of the MTJs can then be advantageously rotated by 180° by means of ion bombardment. In this way, it is possible, using standard lithographic techniques and etching techniques, to obtain two elliptical MTJs with a remanent opposite direction of magnetization of the reference layers (marked only as arrows in FIG. 1). As an example, this can also be adjusted selectively for each of the MTJs disposed on the sample, for instance by covering by means of masks.

Mutually orthogonal conductors in the zone of the MTJs then make it possible, depending on signal conditions and the desired logic, to generate magnetic fields that are oriented parallel both to the major axis and also the minor axis of each elliptical MTJ. The field intensities of the magnetic fields should be identical for both MTJs. The logical input variables of the logic-circuit array can then be expressed in the form of currents $I_{in1}/I_{in2}$ on the mutually parallel upper conductors in FIG. 1. In this case, positive currents represent the input signal "1" and negative currents the input signal "0". The magnetic field developed around the conductors is oriented in the direction of the long axis of the MTJs. The overlap of the two magnetic fields leads to a negative field for (0,0), to a zero field for (1,0) and (0,1) and to a positive field for (1,1) (see FIGS. 2a and b).

An additional possibility consists in applying pinned magnetically hard FM strips to the conductors for the current $I_{in}$. The thickness of the FM strips and the direction of pinning should be selected in such a way that a stray field is developed whose amplitude is the same as but whose direction is opposite to that of the magnetic field induced by the current $I_{in}$ flowing through the conductors. This leads to a corresponding magnetic field at (0,0) in FIG. 2 for zero current through both conductors, to a zero field for a positive current through only one conductor ((1,0)/(0,1)), and to a positive field for positive currents through both conductors (1,1). This has the advantage that no bipolar currents whatsoever are needed. The third possibility for this type of magnetic logic is the definition of $H_{in}=0$ for (0,0), a small positive $H_{in}$ for (0,1)/(1,0), and a large positive $H_{in}$ for (1,1), as shown in FIG. 3. In this case, no negative currents, other than the initialization step, and no additional magnetic layers are necessary. The explanations hereinafter do use the first approach, but they are valid for all three of them. The output of the magnetic logic can be inferred from the resistance of the two MTJs. One possibility for interconnecting the two MTJs is a parallel or serial connection of the two MTJs (high conductivity/low resistance means logical "1", low conductivity/high resistance means logical "0"). This configuration is used for the explanations hereinafter. Alternatively a measurement of the difference between the conductivities of the two MTJs can also be used to obtain the logical output (no resistance difference means logical "0", large resistance difference means logical "1"). The current for the function selection $I_{fs}$ and the corresponding magnetic field $H_{fs}$ perpendicular to the longitudinal axis of the MTJ is then responsible for selection of the logic function.

Figure 2B:
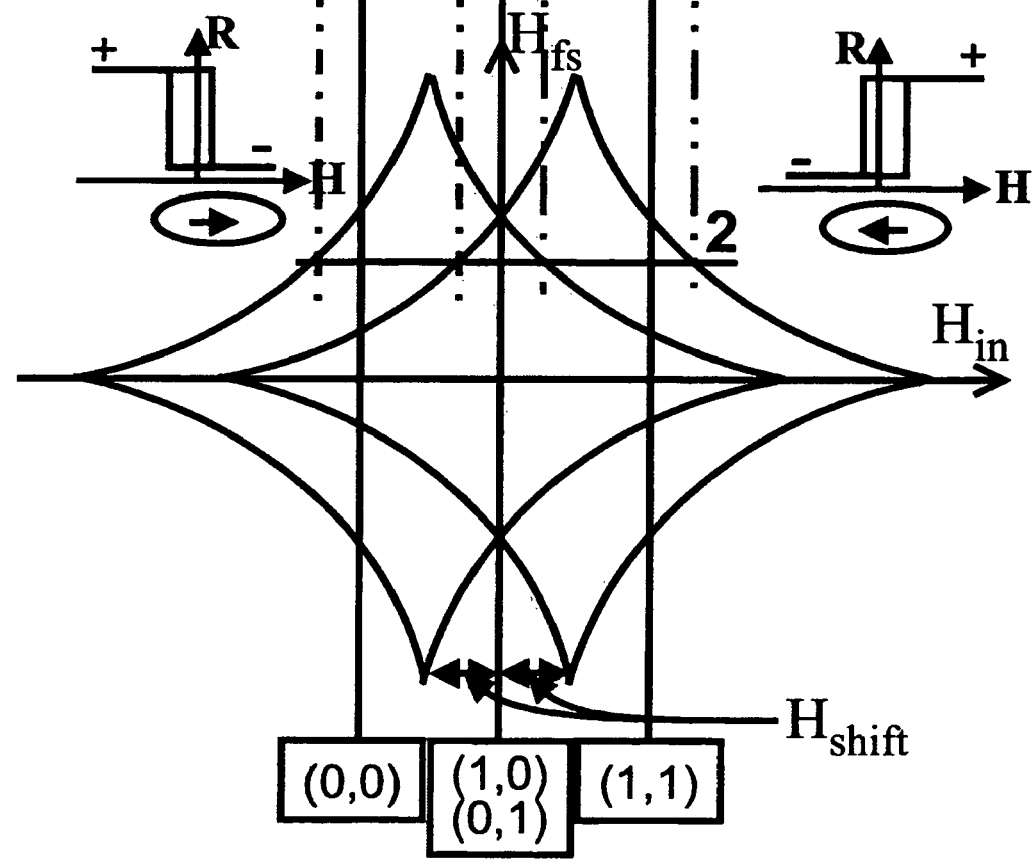

FIGS. 2a and 2b show asteroid diagrams, recorded by means of minor-loop measurements, that describe the switching field of the magnetically soft layer of the two MTJs. The asteroid diagrams are disposed offset from one another in opposite directions relative to $H_{in}=0$. The offset may be caused by a magnetostatic interaction at the interface (Néel coupling) in the case of large MTJs having a size of several μm and a significant correlated roughness of the two surfaces between the barrier and the two FM layers. In the case of smaller MTJs, the displacement is dominated by the stray-field coupling between the two FM layers, thus causing an increasing displacement with decreasing size of the MTJs [3]. The magnitude of the stray-field coupling can be adjusted by adjusting the magnetic net moment of an artificial ferrimagnet (AFi) in the reference layer. The switching fields for the magnetic field $H_{fs}$ for function selection, which field is marked by the horizontal line "1" in FIG. 2a, are indicated by dashed lines for the case of prior positive saturation of the sample and by dotted lines for the case of prior negative saturation. In the upper part of FIG. 2a, the corresponding resistance of the individual MTJ as a function of $H_{in}$ is indicated by a "+" for high resistance and a "−" for low resistance. If both MTJs exhibit a low resistance, the logical output of the entire array is "low", whereas one or two MTJs with a high resistance represent the "high" output. Comparison of the effective fields H(i,j) for the logic signals (vertical solid lines in FIG. 2a) with the total resistance shows that a high resistance and a low current are obtained for (1,1) and (0,0), corresponding to output 0, and a low resistance/high current are obtained for (1,0) and (0,1). This corresponds to the XOR function.

In order to obtain a nonvolatile output, the pulses should occur in a time sequence in which $H_{fs}$ is turned on first, thereby selecting the logic function (at "A" in FIG. 4b). Then it is not necessary to deal with a large number of possible minor loops that indicate flipping in accordance with the field asteroids. In order to understand what is happening, it is sufficient to regard the minor loops of the two MTJs that belong to the selected value of $H_{fs}$ (see upper part at "A" in FIG. 4b). In this case, the currents $I_{in1}$ and $I_{in2}$ are turned on by the two conductors perpendicular to the longitudinal axis of the MTJs and corresponding to the logical input (for example, (1,1) at "B" in FIG. 4b). During this step, the magnetization of the free magnetic layers of the two MTJs switches to a configuration that fixes the logical output. This condition can therefore be stored permanently. Then $H_{fs}$ is turned off again (at "C" in FIG. 4b), before finally $H_{in}$ is also turned off (at "D" in FIG. 4b). For high values of $H_{fs}$ above the point at which the asteroids intersect the $H_{fs}$ axis (at "X" in FIG. 4b), it is not practical to turn off $H_{in}$ before $H_{fs}$ is turned off or clearly reduced, since otherwise the magnetization of one of the MTJs can switch back and the output then remains volatile. For values of $H_{fs}$ lower than that used in FIG. 4b, the sequence of switching the fields is not as relevant.

For case "1" of $H_{fs}$ as shown in FIG. 2a, the logic function is independent of the initial status of the circuit. For other values of $H_{fs}$, it is possible to obtain other logic functions, depending on the initial status of the circuit. As an example, the upper part of FIG. 2b shows the resistances for $H_{fs}$="2". In this case, an initial negative saturation induces an AND function, whereas a NOR function is obtained for an initial positive saturation. In order to use these values for $H_{fs}$, a first initialization step is necessary, in which the free layer of both MTJs is saturated in one direction before the logic function can be used, in order to ensure that the cycle will be started in a well-defined status of the system. Without using a pinned ferromagnetic layer on the conductors, this can be achieved, for example, by simultaneously setting the input variables to (0,0) and $H_{fs}$ to a value as shown at "1" in FIG. 2, or alternatively by using a higher current $I_{in1}$ and $I_{in2}$. If a layer pinned ferromagnetically in one direction on the conductors is used, only one pulse of $H_{fs}$ is sufficient for initialization.

By changing $H_{fs}$ and thereby displacing the entire low resistance zone as a function of $H_{in}$ (see the cross-hatched region in FIG. 5), it is possible to adjust various other logic functions. Table 1 presents a list of all the possibilities. On the left side of Table 1, the total resistance is symbolized by upper circles for high resistance and lower circles for low resistance, corresponding to FIG. 2. Based on the method selected for measuring the output signals, different logic functions result from this distribution of $R_{total}(H_{in})$ (see right side of Table 1). The distribution of $R_{total}$ in the last row cannot be achieved with the same MTJs as for the XOR/XNOR function, because a large range of low resistance is necessary to prevent only (0,1)/(1,0) from occurring in a status of low resistance. This corresponds to a greater displacement of the asteroids, and therefore to a different structure of the stack of layers.

For all explanations in the foregoing paragraphs, the system described contained MTJs with an influence on EB pinning of the reference layer, by means of ion bombardment in a magnetic field. Furthermore, this type of embodiment will also be demonstrated hereinafter, using a practical implementation of this principle. Obviously other implementations of this type of magnetic logic are also fundamentally conceivable. For example, it is possible to use other magnetoresistive effects, such as giant magnetoresistance (GMR), or even as yet unknown effects that induce a change of the resistance of the system when the relative orientation of two ferromagnetic layers is changed. As regards the recently achieved high effectivity, now with a maximum value of 472% at room temperature [4], and the fact that the technically similar MRAM technique with MTJs has become commercially available [5] in the meantime, TMR is currently the best candidate for achieving a corresponding magnetic logic.

In principle, it is also possible to find other MTJ characteristics that can be changed when the relative orientation of the magnetization direction is changed and that can be used instead of the resistance to establish the logical output.

TABLE 1

Resistance as a function of $H_{in}$ (positive $H_{in}$, increasing to the right) for different $H_{fs}$ ($H_{fs}$ decreasing from top to bottom) and correspondingly offset range of low resistance (compared with FIG. 5).

| Total resistance | | In | Parallel/series | | Difference signal | |
|---|---|---|---|---|---|---|
| | | | Out | Logic | Out | Logic |
| o   o\|oooo\|oooo  ooo\|ooo | | (0,0) (0,1)/(1,0) (1,1) | 1 0 0 | NOR | 0 1 1 | OR |
| → $H_{in}$ | | | | | | |
| ooo   ooo\|oooo  o\|oooo\|o | | (0,0) (0,1)/(1,0) (1,1) | 1 1 0 | NAND | 0 0 1 | AND |
| ooo\|o   o\|oooo  ooo\|ooo | | (0,0) (0,1)/(1,0) (1,1) | 0 1 0 | XOR | 1 0 1 | XNOR |
| oooo\|ooo   ooo  o\|oooo\|o | | (0,0) (0,1)/(1,0) (1,1) | 0 1 1 | OR | 1 0 0 | NOR |

TABLE 1-continued

Resistance as a function of $H_{in}$ (positive $H_{in}$, increasing to the right) for different $H_{fs}$ ($H_{fs}$ decreasing from top to bottom) and correspondingly offset range of low resistance (compared with FIG. 5).

| Total resistance | In | Parallel/series Out | Parallel/series Logic | Difference signal Out | Difference signal Logic |
|---|---|---|---|---|---|
| ooo o \| ooo o \| o        o<br>             ooo \| ooo | (0,0)<br>(0,1)/(1,0)<br>(1,1) | 0<br>0<br>1 | AND | 1<br>1<br>0 | NAND |
| ooo o \| ooo o \| ooo o \| o<br>                         ooo | | always 0 | | always 1 | |
| o                  ooo<br>ooo \| ooo o \| oooo \| o | | (always 1) | | (always 0) | |

Upper (lower) circles represent high (low) total resistance, induced by a different resistance (two times lower) of the individual MTJ. The vertical lines represent the magnetic fields $H_{in}$ corresponding to logical inputs (0,0), (0,1)/(1,0) and (1,1).
Right: the resulting logic function is obtained from the displacement of the low resistance range, which is shown on the left side for serial/parallel wiring and on the right side for measurement of the resistance difference (note the different width of the low resistance range in the last row).

Table 1: Resistance as a function of $H_{in}$ (positive $H_{in}$, increasing to the right) for different $H_{fs}$ ($H_{fs}$ decreasing from top to bottom) and correspondingly offset range of low resistance (compared with FIG. 5). Upper (lower) circles represent high (low) total resistance, induced by a different resistance (two times lower) of the individual MTJ. The vertical lines represent the magnetic fields $H_{in}$ corresponding to logical inputs (0,0), (0,1)/(1,0) and (1,1). Right: the resulting logic function is obtained from the displacement of the low resistance range, which is shown on the left side for serial/parallel wiring and on the right side for measurement of the resistance difference (note the different width of the low resistance range in the last row).

It is also possible to use techniques other than ion bombardment in a magnetic field for local manipulation of the direction of the EB, for example local heating with a laser, growth of the reference electrodes of the two MTJs one after the other in differently oriented magnetic fields, or any other technique capable of causing local variation of the unidirectional anisotropy of a ferromagnetic material. At present, however, ion bombardment appears to be the most suitable possibility for local manipulation of an entire wafer within the framework of industrial production, since it is difficult, for example, to achieve manipulation of the EB for large zones by means of lasers, whereas this can be done for the entire wafer in the case of ion bombardment, by using a lacquer mask. The use of separate growth of the MTJs in the magnetic field increases the number of necessary steps for sputtering and lithography and therefore does not seem to be particularly cost-effective.

It is also possible to contemplate replacing EB with something else capable of being used to maintain the direction of magnetization of the reference layer, at least up to the maximum magnitude of the magnetic field within the area of application of a corresponding magnetic logic-circuit device, provided that local manipulation of the opposite orientation of this magnetization can be achieved with this magnetic field. A possible example for this is the use of an additional ferromagnetic layer with very strong uniaxial anisotropy and a very high coercive field intensity, thus ensuring that the magnetization cannot be altered by any of the magnetic fields to which the magnetic logic-circuit array will be exposed. If this magnetic layer is coupled to the reference layer, for example by means of antiferromagnetic intermediate-layer exchange coupling to an MTJ by a nonmagnetic intermediate layer such as ruthenium, then the direction of magnetization of the reference layer is fixed for all external magnetic fields that are not strong enough to alter the direction of magnetization of the additional magnetically hard layer or to overcome the coupling with the intermediate layer. The relative orientation of the magnetization of two ferromagnetic layers, caused by the intermediate-layer exchange coupling, can be changed locally from antiparallel to parallel by ion bombardment. This means that the direction of the reference layer can be rotated locally by 180°. In this way, all the requirements for the proposed type of magnetic logic are fulfilled. Compared with the use of EB, this technique is less advantageous, since larger ion doses are needed in order to change the antiferromagnetic intermediate-layer coupling to ferromagnetic coupling. This higher ion dose may be problematic if the reference electrode in an MTJ having a design unsuitable for this intended use must be manipulated after application of the complete MTJ. In this case a larger ion dose may cause greater impairment of the sensitive barrier and considerably worsen the correct function of the MTJ. For this procedure, therefore, it may be necessary to carry out ion bombardment before application of the barrier layer. This is an interesting option for the manipulation of EB, but the effect of this approach on the growth of the subsequent layers has not yet been investigated in detail. The generation of magnetic fields responsible both for the logical input, and for selection of the logic function and generation of a well-defined initialization status, are achieved most simply by currents through the conductors on the chip, since these conductors can be produced using the familiar techniques used at present for the production of computer chips, for example. However, it is obviously also conceivable that the magnetic fields can be produced, for example, by magnetic stray fields of a tip of a magnetic force microscope. In this situation it is conceivable to use a large number of tips in parallel, as is described in the IBM Millipede Project for data storage by means of an array of atomic force microscopes. Alternatively, it is also possible to use new techniques in the area of micro-electromechanical systems (MEMS) to vary the effective magnetic field at the position of the logic element.

In summary, it can be said that two ferromagnetic layers are necessary, one fixed by means of pinning and one that can freely follow external magnetic fields. The relative orientation of these ferromagnetic layers must be measured in a suitable way, such as by magnetoresistive effects in the present case.

The objective of the following test of the principle is to demonstrate that the concept of this novel magnetic logic described in the foregoing can actually be implemented in practice. It is shown that it can be applied to existing examples that were produced for other purposes, and that therefore were not optimized in some way for the needs of this type of logic or even in any way at all for magnetic logic in general. For industrial application, techniques similar to those for the production of MRAMs would be tested for the production of a good MTJ, for example with regard to selection of the shape of the MTJ, to optimization of the layer arrangements and layer compositions of the layers, etc., as have been obtained by numerous different research groups in the past and have culminated in the development of a product [5] that is now commercially available.

To test the principle a sample was used that is described in [6]. The sequence of layers is composed of 25 nm of Cu/12 nm of $Mn_{83}Ir_{17}$/3 nm of $CO_{70}Fe_{30}$/1.3 nm of Al+plasma oxidation/4 nm of $Ni_{80}Fe_{20}$/3 nm of Ta/47 nm of Cu/26 nm of Au. These were heat-treated at 275° C. for one hour in a magnetic field at HFC=1000 Oe. Part of the sample was bombarded with helium ions (10 keV, $3\times10^{15}$ ions/cm$^3$) in a magnetic field $H_{1B}$ perpendicular to $H_{FC}$, and then heat-treated once again for one hour at 275° C. without an external magnetic field. To adjust an antiparallel orientation of the magnetization direction of the reference layer, a part of the sample not bombarded with ions was removed and rotated by 90°. New MTJs were structured on both parts. Then the underlying connecting conductors were connected, and rectangular MTJs measuring 100 μm×100 μm, one not bombarded with ions and the other bombarded with ions, were contacted by means of gold wires (see FIG. 6 in this regard).

FIG. 7 shows minor loops (10 mV bias voltage) measured on an MTJ that had only been cooled in a field (TMR=48.5%, $R^a_{min}$=3.6 M'Ωμm$^2$), on an MTJ that had been cooled in a field and additionally bombarded with ions (TMR=35.6%, $R^a_{min}$=6.8 M'Ωμm$^2$) and on a serial-wired array of these two MTJs ($R^a_{min}$=10.5 M'Ωμm$^2$). It can be stated that flipping of the MTJ that had not been bombarded with ions (at positive values of $H_{in}$) results in a 27% smaller change in resistance of the MTJ array than flipping of the MTJ that had been bombarded with ions, even though its TMR value is 36% higher. This is due to the greater resistance and to the resulting greater absolute change in resistance of the MTJ that had been bombarded with ions. By measuring minor loops of two connected MTJs for various values of $H_{fs}$ (see FIG. 8), it is possible to determine the switching-field asteroids of the two MTJs, as shown in FIG. 9. It is obvious that the coercive field intensity of the free layer is smaller than the displacement of the asteroids. Therefore it is not possible to use this as NOR and AND functions with these two MTJs wired in series. Furthermore, the logical output is volatile, since these MTJs have only a resistance status with remanence. Moreover, $H_{in}$ and $H_{fs}$ were simulated by Helmholtz coils ((0,0): −13 Oe, (0,1)/(1,0): 0 Oe and (1,1): 17 Oe), whereas the resistance of the serial array of the MTJs was measured. FIG. 10 shows the measured values for $H_{fs}$=3 Oe for the case of initialization with positive $H_{in}$. Only after 5 seconds was $H_{fs}$ set to 3 Oe. Then the sample was saturated at 60 Oe for 15 seconds, before $H_{in}$ was set to a value corresponding to the logical input for 25 to 30 seconds. Thereafter, the logical output is visible. After 45 seconds, $H_{fs}$ was turned off and finally, after 55 seconds, $H_{in}$ was also turned off. This type of measurement was carried out for all three values of $H_{in}$ corresponding to the logical inputs (0,0), (0,1)/(1,0) and (1,1). The time dependence of the magnetic fields for the input (1,1) is sketched in the upper part of all lower diagrams of FIG. 10. The times between the switching steps and the longer and varying duration of the reversal of the magnetic fields and the corresponding change in the resistance are not a typical property of this kind of magnetic logic, but instead result from the manual switching devices used for the currents through the Helmholtz coils. The result of the measurements shows, in FIG. 10a, a high resistance (output "0") for (1,1) and a low resistance (output "1") for (0,1)/(1,0) and (1,1). This represents a NAND function. Similarly, the OR and XOR functions were measured for $H_{fs}$=3 Oe after initialization with a negative magnetic field (FIG. 10b) and for $H_{fs}$=13 Oe after initialization with a positive magnetic field (FIG. 10c). A resistance above the marking indicates a logical output of "0", whereas a resistance below the marking is identical to a logical output of "1". The resistances of the measurements with the logical input (1,1) in FIG. 10b differ from the measurements of the other diagrams of FIG. 10 because of imperfect contacting between the gold tips and the MTJs, causing the measurement to react sensitively to the mechanical influences of the environment. The fact that the initial resistance (for more than 35 to 45 seconds in these measurements) for the logical inputs (0,0) and (1,1) in FIG. 10c is clearly different can be explained by the different TMR values/resistances of the two MTJs being used (see FIGS. 7 and 8). This clearly demonstrates the importance of an absolutely equal change of the resistances of the two MTJs for the case of wiring in series. In addition, the values of $H_{in}$ for the logical input do not perfectly match the values of $H_{fs}$ selected for these two MTJs. Nevertheless, the XOR function can be clearly identified.

To make available all logic functions and a nonvolatile output, small elliptical MTJs coupled by a stray field and adapted by selection of a net moment of an AFi should be used. In this way, two overlapping asteroids with two resistance states at remanence are achieved, as shown in FIG. 2. For serial wiring, it is possible to compensate for differences in the TMR amplitudes or in the resistance between MTJs bombarded with ions and MTJs not bombarded with ions by adjusting the element size, in order to achieve an identical change in resistance, regardless of the respective switching MTJ (see FIG. 10c). A disadvantage of measuring the resistance of serial-wired MTJs is the smaller relative change in magnetoresistance of the two MTJs compared with each individual MTJ (see FIG. 7).

In contrast, the full TMR values can be achieved for measurement of the resistance difference. For this case, however, it is not possible to compensate for the different resistance values of MTJs that have been bombarded with ions and MTJs that have not been bombarded with ions by varying the element size. For this reason, equality of all MTJs must be guaranteed, in this case, by proper selection of the ion dose and of the energy during ion bombardment, preferably through the use of a stacked array with the pinned ferromagnetic layers above the separating layer, in order to minimize defects in the separating layer during ion bombardment, followed by heat treatment to remove possible defects.

BIBLIOGRAPHY

[1] W. J. Gallagher and S. S. P. Parkin, Development of the magnetic tunnel junction, MRAM at IBM: From first junctions to a 16-Mb MRAM demonstrator chip, IBM Journal of Research and Development 50, 5 (2006).
[2] R. Richter, L. Bar, J. Wecker and G. Reiss, Nonvolatile field programmable spin-logic for reconfigurable computing, Applied Physics Letters 80, 1291 (2002).
[3] D. Meyners, K. Rott, H. Brückl, G. Reiss and J. Wecker, Submicron-sized magnetic tunnel junctions in field programmable logic gate arrays, Journal of Applied Physics 99, 023907 (2006).
[4] J. Hayakawa, S. Ikeda, Y. M. Lee, F. Matsukura and H. Ohno, Effect of high annealing temperature on giant tunnel magnetoresistance ratio of CoFeB/MgO/CoFeB magnetic tunnel junctions, Applied Physics Letters 89, 232510 (2006).
[5] Freescale Semiconductor, Data Sheet 256K×16-Bit 3.3-V Asynchronous Magnetoresistive RAM, MR2A16A, 2006, Document Number: MR2A16A, Rev. 3, June 2006, published at http://www.freescale.com.
[6] V. Höink, M. D. Sacher, J. Schmalhorst, G. Reiss, D. Engel, D. Junk and A. Ehresmann, Postannealing of magnetic tunnel junctions with ion-bombardment-modified exchange bias, Applied Physics Letters 86, 152102 (2005).

The invention claimed is:

1. Reconfigurable magnetic logic-circuit array having at least two magnetoresistive elements, each composed of at least two magnetic layers, which are separated from one another by an intermediate layer, in each instance, whereby one of the magnetic layers, as a reference layer, does not substantially change its magnetization under the influence of external magnetic fields, and the other magnetic layer, as a free layer, changes its magnetization perceptibly under the influence of external magnetic fields, and having at least one conductor for at least two signal ports, with which conductor, when current is flowing, a first magnetic field can be generated that acts on the magnetoresistive elements and flips the magnetization of the free layers, and having a device for on-demand generation of a second variable magnetic field, which also influences the magnetoresistive elements,
wherein
two such magnetoresistive elements are disposed adjacent to one another, whereby the magnetization of the two reference layers is oriented in opposite directions by means of preadjusted unidirectional anisotropy, and the magnetoresistive elements are interconnected with one another in such a manner that, as a result of the action of the first and second magnetic fields on the magnetoresistive elements, the switching behavior of all basic logic functions, especially the AND, OR, NAND, NOR, XOR or XNOR functions, can be induced on the basis of the resulting changes in the orientation of the magnetization of the free layers, and thus of the resistance of the magnetoresistive elements in the logic-circuit array.

2. Logic-circuit array according to claim 1, wherein the device for on-demand generation of the second variable magnetic field comprises a conductor that can carry current and is oriented in a position perpendicular to the conductor for the at least two signal ports.

3. Logic-circuit array according to claim 1, wherein a magnetically active element is disposed in the zone of the logic-circuit array, and preferably the conductor or conductors for the at least two signal ports of the second variable magnetic field comprises or comprise such a magnetically active element, whose magnetic field is oriented parallel or antiparallel to the magnetization of the reference layer of the magnetoresistive elements.

4. Logic-circuit array according to claim 1, wherein the first and second magnetic fields overlap in such a way with respect to the circuit of the magnetoresistive elements that the switching behavior of all basic logic functions, especially the AND, OR, NAND, NOR, XOR or XNOR functions, can be optionally adjusted to the circuit of the magnetoresistive elements.

5. Logic-circuit array according to claim 1, wherein the switching asteroids of the two oppositely pinned magnetoresistive elements are disposed offset from one another by virtue of the exchange-bias coupling (EB) of the reference layers.

6. Logic-circuit array according to claim 1, wherein the magnetic layers of the magnetoresistive elements are formed from ferromagnetic materials.

7. Logic-circuit array according to claim 6, wherein the reference layers of the magnetoresistive elements each have a magnetically hard material.

8. Logic-circuit array according to claim 6, wherein the free layers of the magnetoresistive elements each have a magnetically soft material.

9. Logic-circuit array according to claim 6, wherein the ferromagnetic material contains CoFe, NiFe, CoFeB or Heusler compounds.

10. Logic-circuit array according to claim 1, wherein the unidirectional anisotropy of the reference layer of the magnetoresistive elements is developed by virtue of exchange coupling between a ferromagnetic and an antiferromagnetic material.

11. Logic-circuit array according to claim 1, wherein the intermediate layer is an insulator layer.

12. Logic-circuit array according to claim 11, wherein the insulator layer contains magnesium oxide MgO or aluminum oxide $Al_2O_3$ as an insulator material.

13. Logic-circuit array according to claim 11, wherein the magnetoresistive elements are tunnel magnetic resistance elements (TMR elements).

14. Logic-circuit array according to claim 1, wherein the intermediate layer is a nonmagnetic metal layer.

15. Logic-circuit array according to claim 14, wherein the magnetoresistive elements are giant magnetoresistance elements (GMR elements).

16. Logic-circuit array according to claim 1, wherein the substantially invariable magnetic behavior of the reference layers of the magnetoresistive elements can be stabilized by additional magnetic layers having strong unidirectional anisotropy and/or high coercive field intensity, which can be coupled to the reference layers by intermediate-layer exchange coupling via a nonmagnetic layer.

17. Logic-circuit array according to claim 1, wherein the unidirectional anisotropy of the reference layers of the two magnetoresistive elements is oppositely oriented by virtue of the exchange bias coupling (EB).

18. Logic-circuit array according to claim 1, wherein the magnetoresistive elements have a rectangular basic shape.

19. Logic-circuit array according to claim 1, wherein the magnetoresistive elements have an elliptical basic shape with a long major axis and a short minor axis.

20. Logic-circuit array according to claim 1, wherein the field intensity at the location of the magnetoresistive elements interconnected with one another is substantially identical.

21. Logic-circuit array according to claim 1, wherein the input signals can be impressed on the circuit of the magnetoresistive elements by at least one conductor, on which individually or simultaneously different current intensities for the different signal levels of a logical 0 or a logical 1 are output to the circuit of the magnetoresistive elements.

22. Logic-circuit array according to claim 21, wherein the magnetic fields caused by the input signals on the conductor overlap in such a way that a targeted change in the magnetization of the free layers of the magnetoresistive elements induces a change in the overall behavior of the circuit of the magnetoresistive elements.

23. Logic-circuit array according to claim 1, wherein the conductors for impressing the input signals are disposed in such a way relative to the magnetization direction of the magnetoresistive elements that the generated magnetic field is oriented parallel to the magnetization direction of the reference layers.

24. Logic-circuit array according to claim 1, wherein each input signal for switching the magnetoresistive elements is provided with its own conductor.

25. Logic-circuit array according to claim 1, wherein the magnetic effect induced in the magnetoresistive elements by the at least one conductor is formed in such a way that a negative field with a negative current is established for both signals, a zero field with one positive and one negative current is established for respectively one of the two signals, and a positive field with a positive current is established simultaneously for both signals.

26. Logic-circuit array according to claim 1, wherein pinned magnetically hard paths are applied on the at least one conductor for impression of the input signals in such a way that a stray field is obtained whose amplitude is equal to but whose orientation is opposite to those of the magnetic field that would be obtained on the basis of current flow through the conductor.

27. Logic-circuit array according to claim 26, wherein the stray field can be established by the thickness of the pinned magnetically hard paths and the direction of pinning.

28. Logic-circuit array according to claim 26, wherein the first magnetic field induced by the current through the conductor having the two ports and the additional magnetic field parallel or antiparallel thereto overlap in such a way that a negative field with a zero current is established for both signals, a zero field with a current is established for only one of the two signals, and a positive field with a current is established simultaneously for both signals.

29. Logic-circuit array according to claim 26, wherein no bipolar currents are necessary for impression of the signals.

30. Logic-circuit array according to claim 1, wherein different positive magnetic field intensities can be used to represent the individual switching responses of the circuit of the magnetoresistive elements.

31. Logic-circuit array according to claim 1, wherein the further magnetic field for adjustment of the switching behavior is oriented perpendicular to the long major axis of the elliptical magnetoresistive elements and the magnetization direction of the reference layers.

32. Logic-circuit array according to claim 1, wherein the circuit of the magnetoresistive elements can be switched to a well-defined initial condition before any switching operation.

33. Logic-circuit array according to claim 32, wherein the well-defined initial condition exhibits positive or negative saturation of the free layers of the magnetoresistive elements.

34. Logic-circuit array according to claim 1, wherein the magnetoresistive elements are interconnected with one another in series.

35. Logic-circuit array according to claim 1, wherein the magnetoresistive elements are interconnected with one another in parallel.

36. Logic-circuit array according to claim 1, wherein the magnetoresistive elements behave in a manner understood as logical 1 in the presence of high conductivity and thus low resistance of the magnetoresistive elements, and in a manner understood as logical 0 in the presence of low conductivity and thus high resistance.

37. Logic-circuit array according to claim 1, wherein a difference between the conductivity or the resistance of the two magnetoresistive elements indicates a switching response of the circuit of the two magnetoresistive elements.

38. Logic-circuit array according to claim 37, wherein zero difference between the conductivity or the resistance of the two magnetoresistive elements is understood as logical 0, and a large resistance difference is understood as logical 1.

39. Logic-circuit array according to claim 1, wherein a large number of preferably identical reconfigurable magnetic logic-circuit arrays is disposed on a common logic circuit.

40. Method for producing a reconfigurable magnetic logic-circuit array according to claim 1,
wherein
before, during or after the production of the magnetoresistive elements, a targeted orientation of the magnetization of the reference layers is produced at least in portions in the zones in which the magnetoresistive elements are disposed, and before, during or after the complete or partial production of the magnetoresistive elements, the orientation of the magnetization of the respective reference layer is changed in the case of fixable magnetoresistive elements or in the zones in which magnetoresistive elements are disposed.

41. Method according to claim 40, wherein the selective change in orientation of the magnetization of the respective reference layer is achieved by ion bombardment in a magnetic field.

42. Method according to claim 40, wherein the selective change in orientation of the magnetization of the respective reference layer is achieved by local heating of the reference layer, preferably by a laser, in a magnetic field.

43. Method according to claim 40, wherein the selective change in orientation of the magnetization of the respective reference layer is achieved by separate sputtering of parts of the magnetoresistive elements in opposite external magnetic fields.

44. Method according to claim 40, wherein the selective change in orientation of the magnetization of the respective reference layer is achieved by covering portions that are not to be changed in the magnetoresistive elements that are not to be changed, preferably by means of covering masks or the like.

45. Method according to claim 1, wherein the magnetoresistive elements with opposite orientation of the magnetization direction of the two reference layers are produced by means of standard lithographic techniques or etching techniques.

46. Method for operation of a reconfigurable magnetic logic-circuit array according to claim 1,
wherein
during operation of the circuit of the two magnetoresistive elements, the free layers of the magnetoresistive elements are first saturated negatively or positively, prior to any switching operation, and then the magnetic field for selection of the logic function is adjusted and/or the logic signals are output to the at least one conductor and, in this way, the magnetization of the free layers of the magnetoresistive elements is changed and the logic response of the circuit is ascertained.

47. Method according to claim 46, wherein the saturation of the free layers of the magnetoresistive elements is selected in a manner that depends on the logic function to be adjusted in the circuit of the magnetoresistive elements.

48. Method according to claim 47, wherein the at least one conductor for supplying the input signals is also used to supply the saturation of the free layers of the magnetoresistive elements.

49. Method according to claim 46, wherein before the logic signals are turned off, the magnetic field for selection of the logic function is turned off.

50. Method according to claim 46, wherein pulsed currents are used for generation of the magnetic field for selection of the logic function as well as for the logic signals.

51. Method according to claim 46, wherein the identical logic-circuit arrays on the common logic circuit simultaneously execute different logic functions, depending on the setting.

52. Method according to claim 46, wherein the identical logic-circuit arrays on the common logic circuit simultaneously execute identical logic functions, depending on the setting.

* * * * *